United States Patent [19]

Morishita et al.

[11] Patent Number: 5,283,428
[45] Date of Patent: Feb. 1, 1994

[54] PHOTOELECTRIC CONVERTING DEVICE AND INFORMATION PROCESSING APPARATUS EMPLOYING THE SAME

[75] Inventors: Masakazu Morishita, Hiratsuka; Seiji Hashimoto, Yokohama; Shigetoshi Sugawa, Atsugi; Hayao Ohzu, Fuchu, all of Japan

[73] Assignee: Canon Kabushiki Kaisha, Tokyo, Japan

[21] Appl. No.: 797,334

[22] Filed: Nov. 25, 1991

[30] Foreign Application Priority Data

Nov. 27, 1990 [JP] Japan .................................. 2-326235
Nov. 29, 1990 [JP] Japan .................................. 2-332681

[51] Int. Cl.⁵ .............................................. H01J 40/14
[52] U.S. Cl. .................................. 250/214.1; 257/448
[58] Field of Search ............. 250/208.1, 211 J, 211 R, 250/214.1; 357/30 G, 30 H, 30 D, 43, 45, 47; 358/213.15–213.19; 257/444, 446, 448, 462

[56] References Cited

U.S. PATENT DOCUMENTS

| | | | |
|---|---|---|---|
| 3,911,269 | 10/1975 | Hart | 250/214 R |
| 4,363,963 | 12/1982 | Ando | 257/448 |
| 4,450,466 | 5/1984 | Nishizawa et al. | 257/297 |
| 4,608,582 | 8/1986 | Nishizawa | 257/497 |
| 4,686,554 | 8/1987 | Ohmi et al. | 257/443 |
| 4,794,443 | 12/1988 | Tanaka et al. | 257/446 |
| 4,810,896 | 3/1989 | Tanaka et al. | 358/213.18 |
| 4,814,846 | 3/1989 | Matsumoto et al. | 257/446 |
| 4,847,668 | 7/1989 | Sugawa et al. | 257/448 |
| 4,866,293 | 9/1989 | Nakamura et al. | 358/213.19 |
| 5,027,177 | 6/1991 | Vasudev | 357/30 |

FOREIGN PATENT DOCUMENTS 0260858 3/1988 European Pat. Off. .
0274236 7/1988 European Pat. Off. .
0277016 8/1988 European Pat. Off. .

Primary Examiner—David C. Nelms
Assistant Examiner—S. B. Allen
Attorney, Agent, or Firm—Fitzpatrick, Cella, Harper & Scinto

[57] ABSTRACT

A photoelectric converting device provided with a control electrode area of a semiconductor of a first conductive type and at least two main electrode areas of a semiconductor of a second conductive type different from the first conductive type, and capable of accumulating photo-generated carriers in the control electrode area. The control electrode area becomes substantially depleted at the resetting operation.

8 Claims, 20 Drawing Sheets

SECTIONAL VIEW ALONG LINE A-A'

SECTIONAL VIEW ALONG LINE A-A'

SECTIONAL VIEW ALONG LINE B-B'

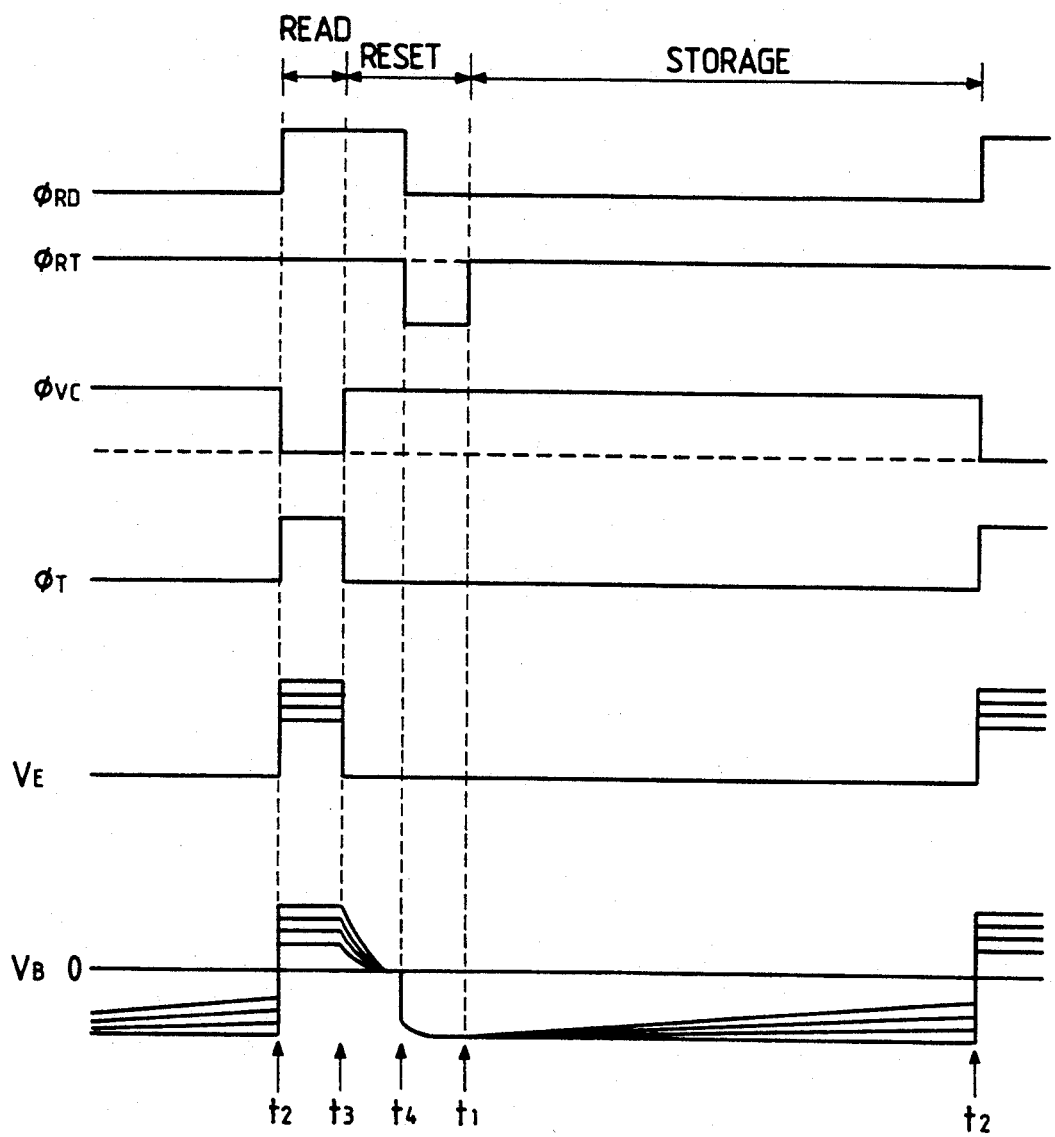

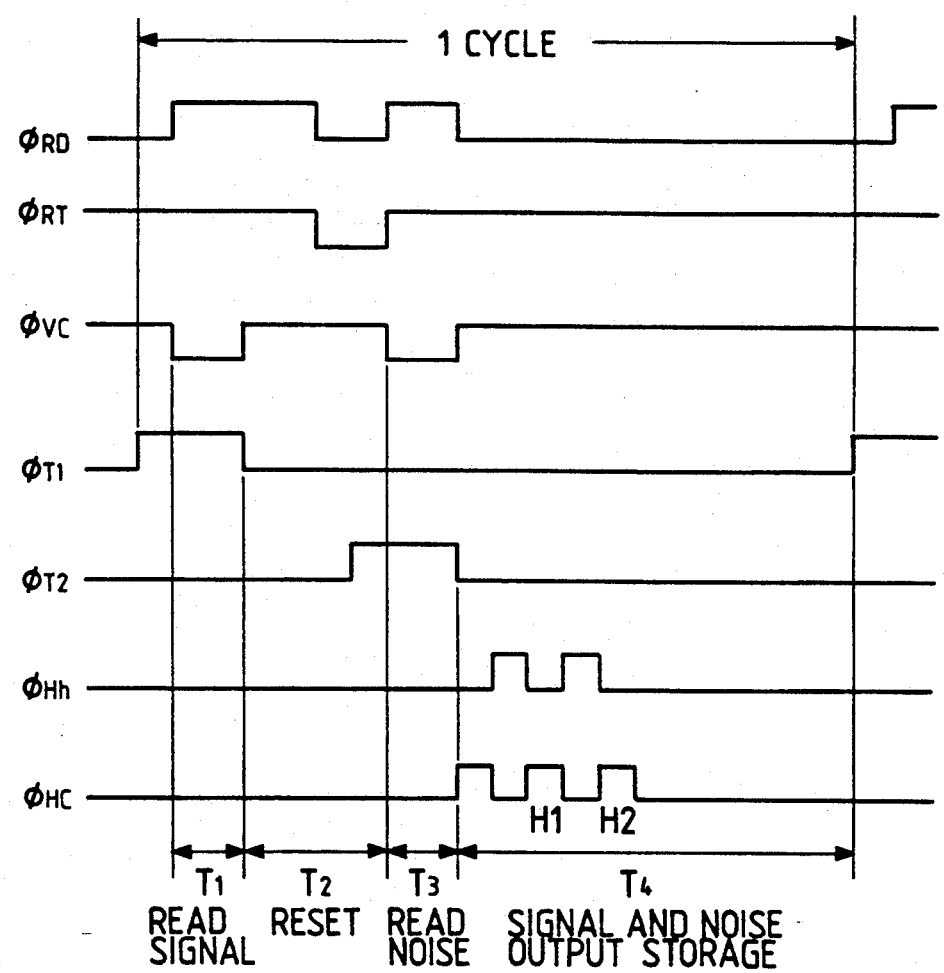

CIRCUIT STRUCTURE

TIMING CHART

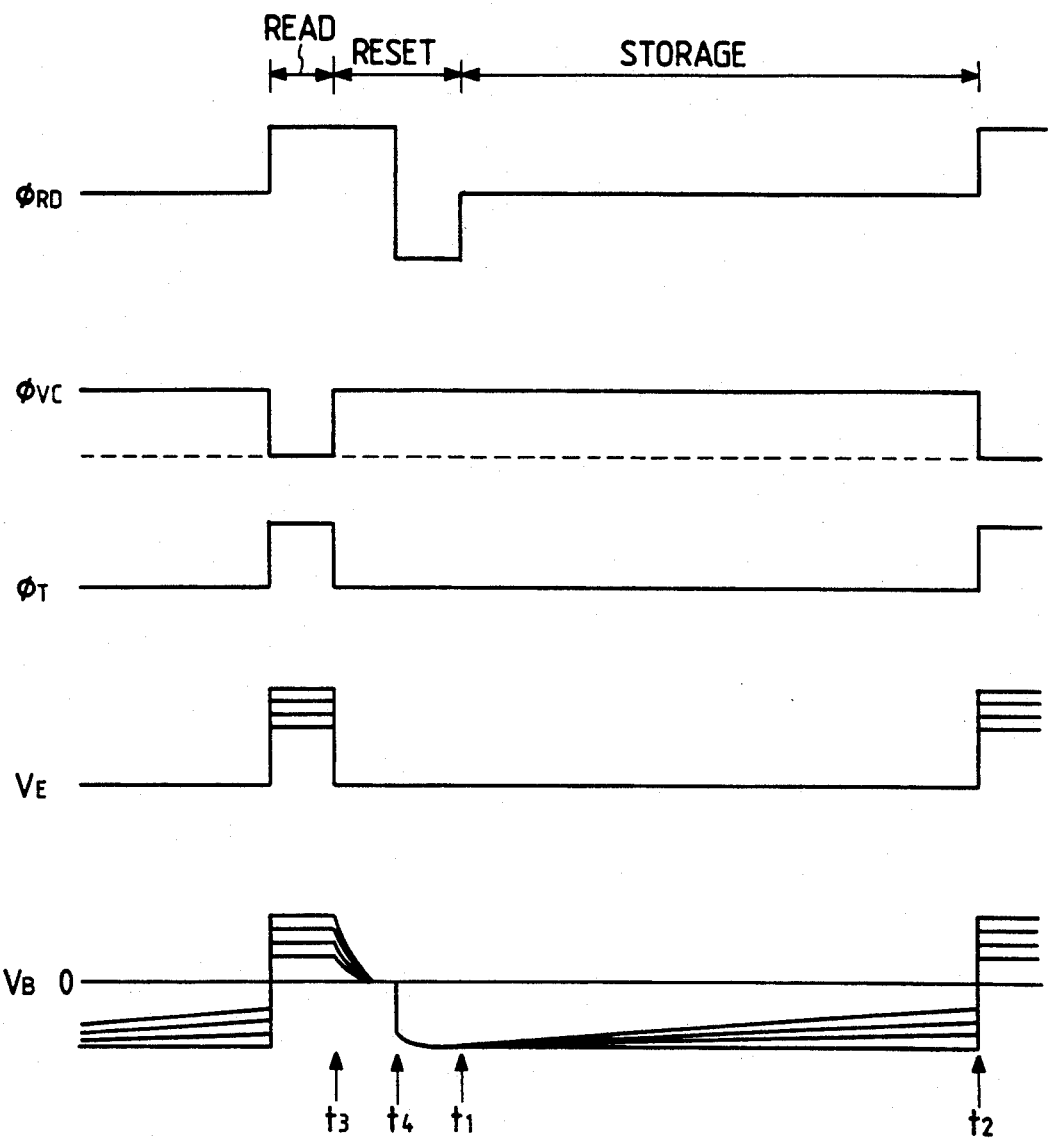

SECTIONAL VIEW ALONG LINE A-A'

SECTIONAL VIEW ALONG LINE B-B'

VOLTAGE CHANGE AT EACH SECTION OF SENSOR

PHOTOELECTRIC CONVERTING DEVICE AND INFORMATION PROCESSING APPARATUS EMPLOYING THE SAME

BACKGROUND OF THE INVENTION

1. Field of the Invention

The present invention relates to an information processing apparatus such as a distance measuring apparatus for automatic focusing of a camera, a copying machine, a facsimile apparatus, an image reader or a video camera, and more particularly a photoelectric converting device to be employed as an image sensor in such apparatus.

2. Related Background Art

The U.S. Pat. No. 4,686,554 granted to inventors Ohmi and Tanaka discloses a charge-accumulating photoelectric converting device of high sensitivity and a low noise level, in which the emitter of a bipolar transistor is connected to an output circuit including a capacitative load. In recent years, however, there are requirements for a higher resolving power, a higher sensitivity and a lower noise level for the photoelectric converting device.

Considered particularly troublesome are noises. The noises in a photoelectric converting device are principally fixed pattern noises and random noises.

Since the fixed pattern noises (FPN) can be compensated for by an external correction circuit, the basic requirement lies in the reduction of the random noises (RN). Stated differently, the reduction of the random noises leads to a higher performance of the sensor.

FIG. 1 is a schematic cross-sectional view of a unit cell of a conventional photoelectric converting device, wherein are shown an n-Si substrate 2', an n$^-$-epitaxial area 2, a p-base area 3, an emitter area 4, and an emitter electrode 5. Also a p-MOS transistor is constituted by a p-area 62, the p-base area 3 and a gate electrode 61. In this photoelectric converting device, among the carriers generated by the incident light, the holes are accumulated in the base, and a signal corresponding to thus accumulated carriers is released from the emitter. Subsequently the p-MOS transistor forms an inversion layer under the gate electrode, whereby the base area 3 is maintained at the same potential as that of the drain area 62 to which a predetermined potential is supplied through the drain electrode 63, and the carriers are thus extracted from the base.

The various experiments of the present inventors have revealed that a cause of the random noises in the photoelectric converting device of the charge accumulating type lies in the incomplete transfer of photogenerated signal carriers in the resetting operation.

Another cause is the noise generation in the functioning of the transistor at the output signal readout.

SUMMARY OF THE INVENTION

In consideration of the technical drawbacks mentioned above, an object of the present invention is to provide an improved photoelectric converting device and an improved information processing apparatus.

Another object of the present invention is to provide a photoelectric converting device in an information processing apparatus with reduced random noises.

Still another object of the present invention is to provide a photoelectric converting device and an information processing apparatus of a structure capable of depleting the control electrode area immediately after a resetting operation thereof, in order to completely dissipate the photogenerated carriers accumulated therein.

Still another object of the present invention is to provide a photoelectric converting device provided with a control electrode area composed of a semiconductor of a first conductive type and at least two main electrode areas composed of a semiconductor of a second conductive type which is different from said first conductive type, and capable of accumulating photogenerated carriers in said control electrode area, wherein said control electrode area becomes substantially depleted at the resetting operation.

Still another object of the present invention is to provide a photoelectric converting device provided with a photoelectric converting cell including a control electrode area of a first conductive type capable of accumulating carriers generated by light energy and first and second main electrode areas of a second conductive type different from said first conductive type, comprising:

first resetting means for maintaining said first main electrode area at a high impedance while substantially depleting said control electrode area; and second resetting means for shifting said first main electrode area to a low impedance state after the resetting operation by said first resetting means.

Still another object of the present invention is to provide a photoelectric converting device comprising:

a first main electrode area including a first semiconductive area composed of a semiconductor of a first conductive type and a second semiconductive area composed of a semiconductor of said first conductive type, having a lower resistance than in said first semiconductive area; a control electrode area composed of a semiconductor of a second conductive type different from said first conductive type and positioned adjacent to said second semiconductive area; and a second main electrode area composed of a semiconductor of the first conductive type and positioned adjacent to said control electrode area;

wherein said control electrode area has a impurity concentration and a thickness which are enough to cause said control electrode area to be substantially depleted at the resetting operation.

Still another object of the present invention is to provide a photoelectric converting device provided with a control electrode area composed of a semiconductor of a first conductive type and at least two main electrode areas composed of a semiconductor of a second conductive type different from said first conductive type, and capable of accumulating photo generated carriers in said control electrode area, comprising a charge-coupled device for transferring the charge in said control electrode area for the purpose of resetting operation.

BRIEF DESCRIPTION OF THE DRAWINGS

FIG. 6 is a timing chart showing the function of said embodiment of the present invention;

FIG. 10 is a timing chart showing the function of the first embodiment shown in FIG. 9;

FIG. 12 is a timing chart showing the function of the 2nd embodiment shown in FIG. 11;

DETAILED DESCRIPTION OF THE PREFERRED EMBODIMENTS

In summary, the present invention suitably selects the effective thickness and the impurity concentration of main electrode areas and a control electrode area of a phototransistor, and the bias voltages applied to the various areas at the resetting operation, thereby causing said control electrode area to be depleted at the resetting operation and thus dissipating the photo-generated and accumulated carriers.

The phototransistor to be employed in the present invention may be a bipolar transistor, a field effect junction transistor or an electrostatic induction transistor.

Also the present invention transfers the photocarriers accumulated in a control electrode area (base or gate), to form an non-stationary depletion layer (potential well) by means of a charge-coupled device in the vicinity of said control electrode area, and to eliminate the carriers remaining in the control electrode area by means of said potential well.

[1st embodiment]

Figure 1:
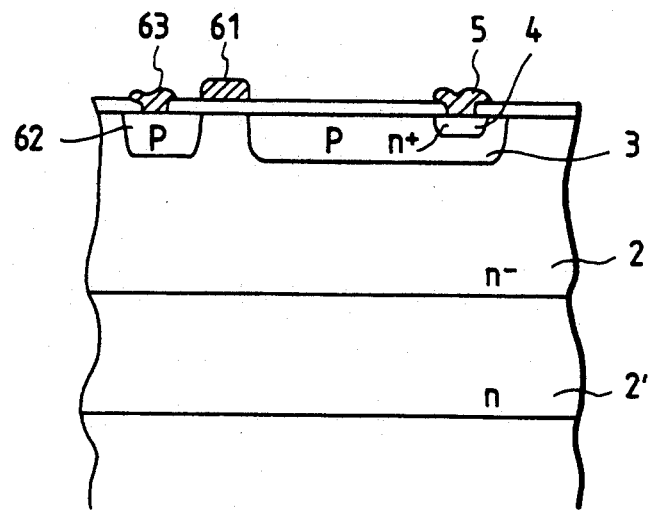
FIG. 1 is a schematic cross-sectional view of a conventional photoelectric converting device.
Figure 2:
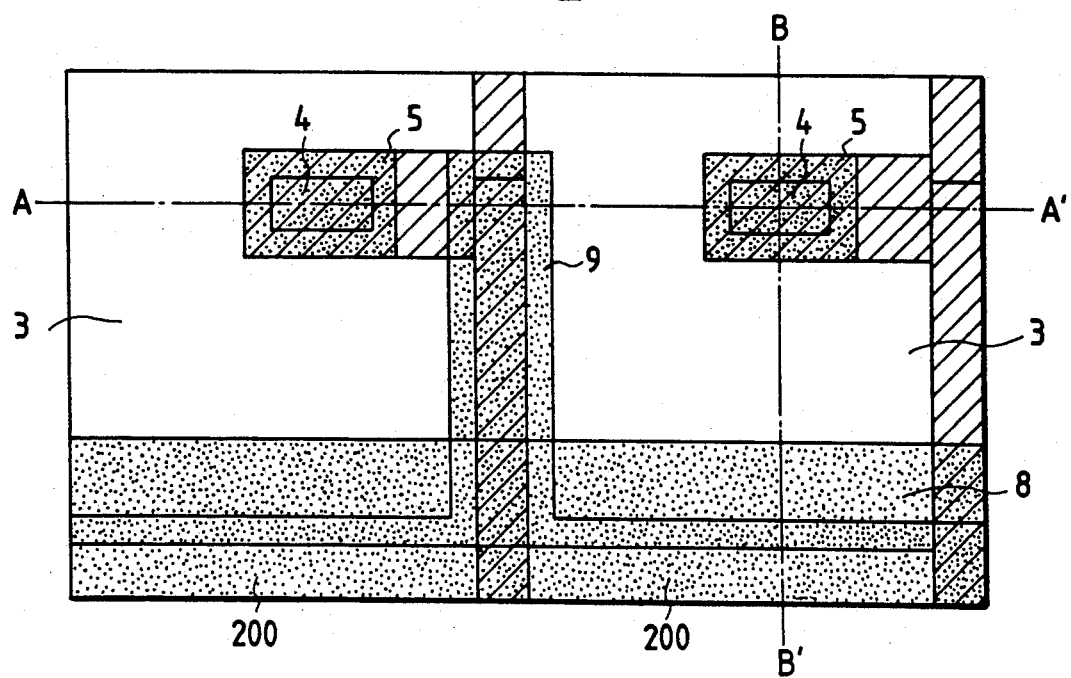
FIG. 2 is a schematic plan view of a photoelectric converting device embodying the present invention.
Figure 3:
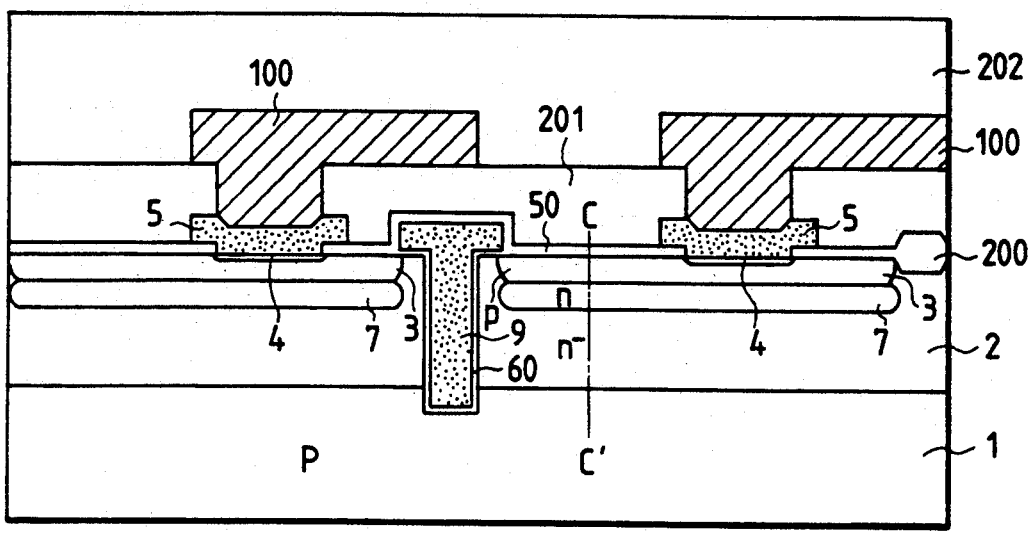
FIG. 3 is a schematic cross-sectional view along a line A-A' in FIG. 2.
Figure 4:
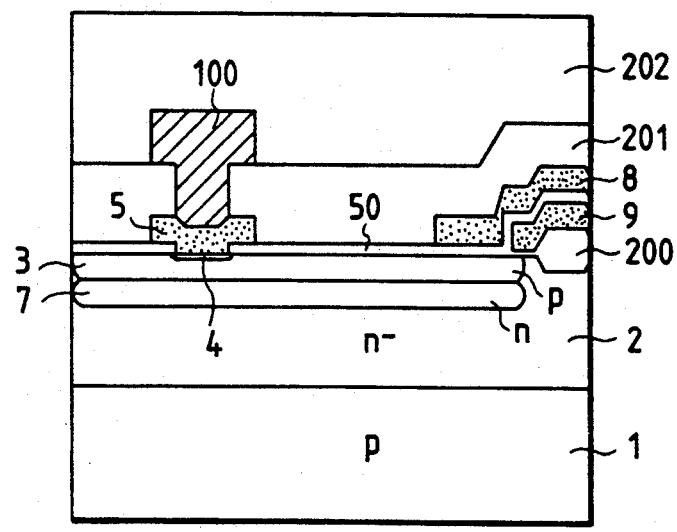
FIG. 4 is a schematic cross-sectional view along a line B-B' in FIG. 2.

FIGS. 2 to 4 are schematic views for explaining the basic structure of a photoelectric converting device embodying the present invention, in which are illustrated are two out of a plurality of photosensor unit cells, wherein FIG. 2 is a plan view of the photosensor cells, FIG. 3 is a cross-sectional view along a line A-A' in FIG. 2, and FIG. 4 is a cross-sectional view along a line B-B' in FIG. 2.

At first the structure of the photosensor cell is explained. On a silicon substrate 1 which is made p-type by doping for example of boron, an n$^-$ area 2 of a low impurity concentration is formed for example by epitaxial growth. In said n$^-$ area 2, there is formed a p-area 3 constituting the base of a bipolar transistor, as a control electrode area, by doping of an impurity such as boron, through impurity diffusion or ion implantation. In said p-area 3, there is formed an n$^+$ area 4 constituting the emitter of the bipolar transistor, as a main electrode area. Said n$^+$ area 4 can be formed either by As diffusion into monocrystalline silicon from an n$^+$ polycrystalline silicon layer 5 containing an impurity such as As or P with a high concentration, or by impurity diffusion or ion implantation prior to the formation of said layer 5. Between the n$^-$-area 2 and the p-area 3, there is provided an n-area 7 which serves to expand the depletion layer to the base area. On the p-area 3, across an insulation film 50, there is provided an electrode 8 for controlling the potential of said p-area 3 maintained in the floating state. Also for the purpose of controlling the potential of the n$^-$-area 2 in the elimination of the charge accumulated in the base area, there is provided, in a groove, an electrode 9 for receiving pulses for potential control across an insulation film 60, and said electrode functions as the transfer electrode of a charge-coupled device. The polycrystalline silicon layer 5 serves to release the signal to the exterior, and a wiring 100, composed for example of aluminum (Al), aluminum-silicon (Al-Si), aluminum-silicon-copper (Al-Cu-Si), tungusten (W), molybdenum (Mo) or molybdenum silicide (MoSi$_2$), is provided thereon and is electrically connected with other devices to constitute an emitter follower output circuit and a resetting circuit. The photosensor cells are mutually separated by a field insulation area 200 composed for example of SiO$_2$ and a groove area (9, 60). On the main face of the semiconductor substrate, there are further provided an interlayer insulation film 201 and a passivation layer 202.

Figure 5:
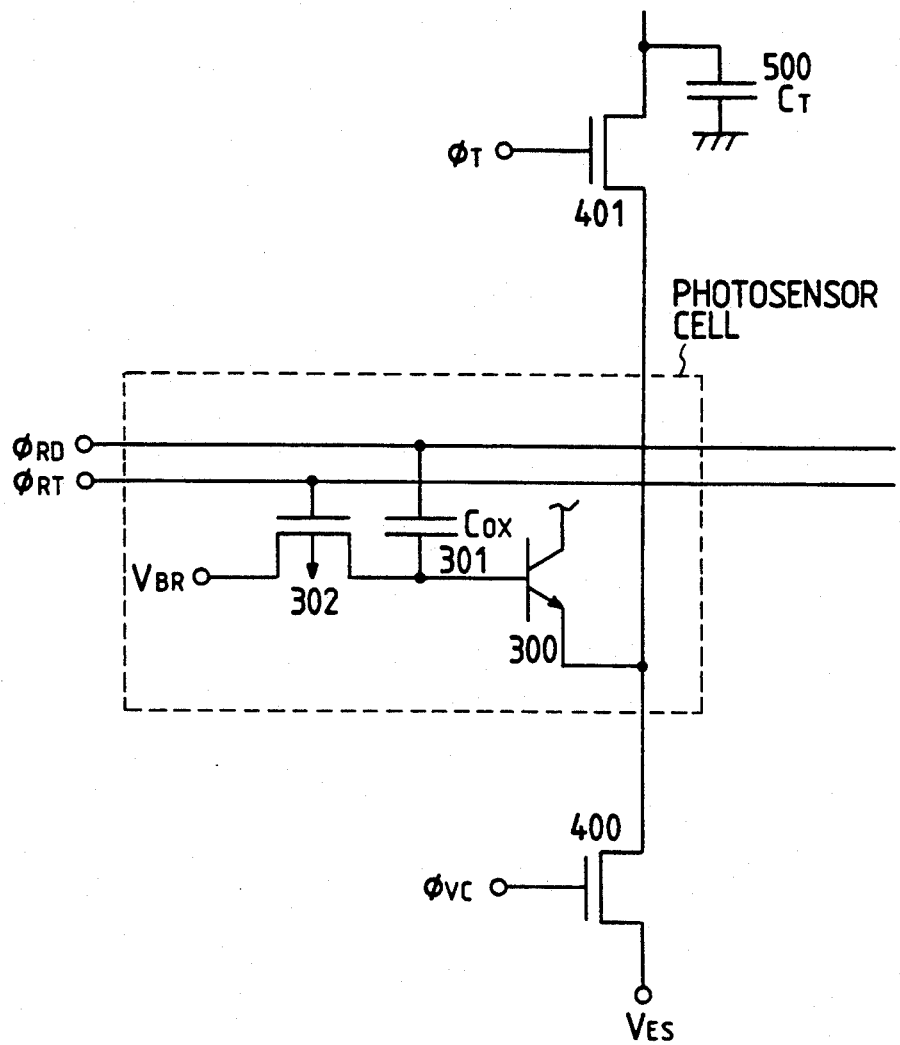
FIG. 5 is a circuit diagram of a pixel in an embodiment of the present invention.

FIG. 5 shows a pixel circuit and a readout circuit of the photoelectric converting device of the present invention. An area surrounded by a broken line indicates a photosensor pixel cell, consisting of an NPN bipolar transistor 300, a charge transfer MOS CCD 302 for resetting the base of said transistor 300 at a predetermined potential, and a capacitance (C$_{ox}$) 301 formed on said base by the electrode 8 and the insulation film 50. The output circuit consists of a capacitative load C$_T$500 for temporarily accumulating the output voltage of the emitter, a transfer MOS transistor 401 for connecting a vertical output line with said capacitative load C$_T$, and a resetting MOS transistor 400 for resetting the vertical output line and the emitter.

The basic function of said photosensor cell consists of (1) charge accumulation by light reception, (2) signal readout, and (3) resetting.

FIG. 6 shows potential change in various parts in said operations, wherein $\phi_{RD}$, $\phi_{RT}$, $\phi_{VC}$ and $\phi_I$ indicate the potential changes of pulse signals applied to terminals shown in FIG. 5, while $V_E$ and $V_B$ indicate the potential changes in the emitter and base areas of the NPN bipolar transistor constituting the photosensor cell.

Now the function of the photoelectric converting device will be explained with reference to FIGS. 5 and 6.

(1) Charge accumulating operation

The charge accumulating operation is initiated from a time $t_1$ when, after the resetting operation to be explained later, the carriers in the base of the bipolar transistor are completely dissipated by inverse biasing of the base and emitter thereof.

As the positive holes, among the carriers generated by the incident light, are accumulated in the substantially depleted base area, there is formed a neutral area therein, whereby the base potential is elevated.

(2) Signal readout operation $\phi_{VC}$ is turned off to disconnect the emitter from the reference voltage source $V_{ES}$, and a positive pulse is applied to $\phi_T$ to turn on the transfer transsistor 401, thereby maintaining the emitter in the floating state. Then a positive pulse is applied to $\phi_{RD}$ to elevate the base potential in the positive side by capacitive coupling through $C_{ox}$ to apply a forward bias between the base and the emitter, whereby the signal readout operation is initiated (time $t_2$). Since the potential of the emitter connected to the capacitive load approaches, by a predetermined value, to the base potential at the end of the signal readout operation at $t_3$, the change in the base potential during the charge accumulating operation appears at the emitter terminal.

(3) Resetting operation

The resetting operation of the photosensor of the present embodiment consists of a combination of at least two operations. In a first resetting operation, $\phi_T$ is turned off while $\phi_{VC}$ is given a positive potential to turn on the transistor, whereby the emitter is fixed at the reference voltage $V_{ES}$. In this state the base potential converges to a fixed value in transient manner ($t_3-t_4$).

In a second resetting operation, the positive potential application to $\phi_{RD}$ is terminated to maintain the base at a negative fixed potential, and a negative potential is applied to $\phi_{RT}$ to form a deep potential well in the $n^-$-area 2 and the n-area 7, thereby transferring the remaining carriers from the base to the reference voltage source $V_{BR}$ and thus resetting the base area. Through the above-explained operations in the circuit shown in FIGS. 2, 3 and 4, the carriers in the base area are completely transferred toward the reference voltage source $V_{BR}$ according to the working principle of the CCD, whereby the base area is reset to zero potential.

The depleted state may also be achieved in another timing. For example the base area can be brought to the depleted state even without the first resetting operation. In this case the period between $t_3$ and $t_4$ becomes zero.

For achieving a higher sensitivity in the photosensor, it is necessary to increase the S/N ratio by increasing the signal output S and reducing the noises N.

Since the signal output is principally determined by the aperture rate, the reduction of noises is the key factor for improvement.

In the sensor of the type of the present embodiment, the random noises can be roughly classified into those remaining after the resetting and those generated at the signal readout.

The noises remaining at the resetting are determined by the number of majority carriers present at the start of charge accumulation. Depending on the number of carriers remaining in the sensor cell at the resetting, there results a fluctuation, leading to the random noises at the resetting. Consequently, the resetting noises can be reduced to zero by eliminating the carriers at the start of charge accumulation.

More specifically, when the base is inversely biased by turning-off of the voltage supplied through $C_{ox}$ at the end of resetting ($t_4$ in FIG. 6), a potential capable of completely depleting the base area by inverse biasing between the base and the collector, and a potential distribution as shown in FIG. 7 is created, whereby the carriers remaining in the base area are completely transferred to the voltage source $V_{BR}$ through the MOS CCD 302.

In this manner the random noises at the resetting can be reduced to zero.

Figure 7A:
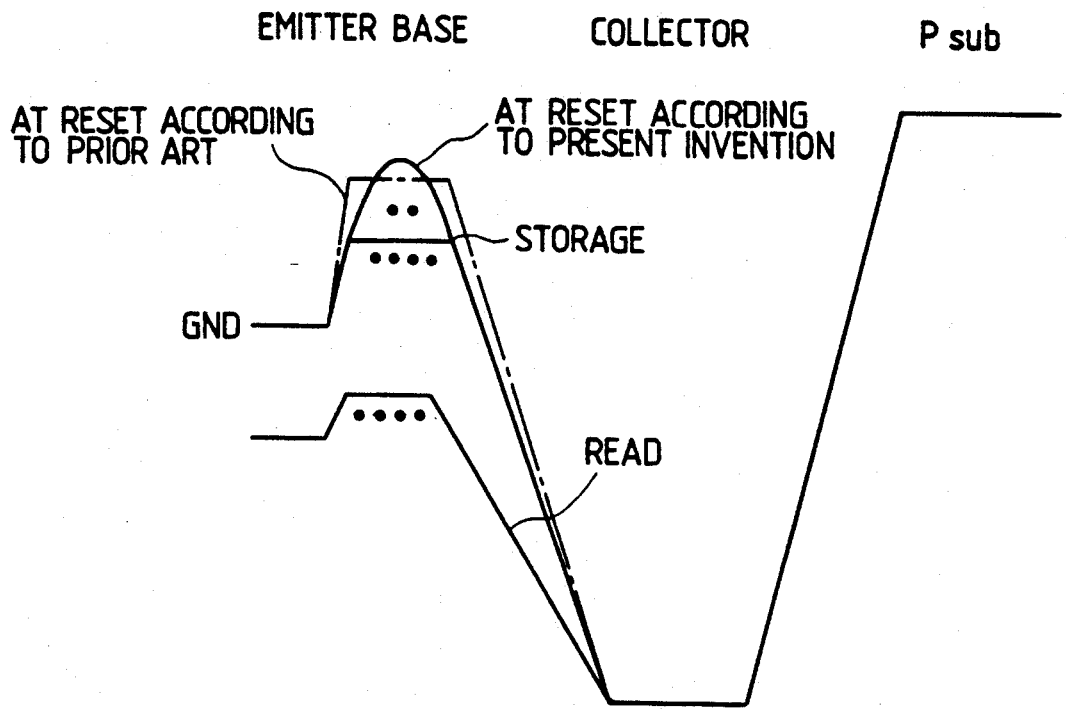
FIGS. 7A and 7B are charts showing the potential distribution in an embodiment of the present invention.
Figure 7B:
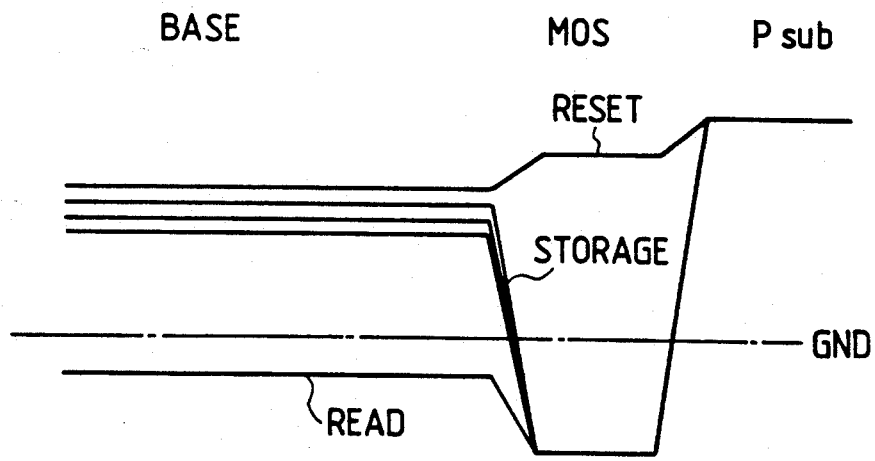

FIG. 7A indicates the potential distribution along the line A-A' in FIG. 3, while FIG. 7B indicates the transversal potential over the base area/MOS transistor/p-substrate, wherein a chain line corresponds to the conventional structure and a solid line corresponds to the structure of the present embodiment. In contrast to the conventional structure in which many carriers remain in the neutral area of the base at the resetting operation, the resetting operation of the sensor of the present embodiment does not leave the carriers in the base area, since the base area is substantially depleted. Since the potential applied to the base in the floating state is determined by $C_{ox}$, a capacitance $C_{be}$ between the emitter and the base, and the division of the capacitance $C_{bc}$ between the base and the collector, the selection of impurity concentration and depth of the base is important in the device design. More specifically, as an inverse bias approximately equal to:

$$-V_{RD} \cdot \frac{C_{ox}}{C_{bc} + C_{be} + C_{ox}}$$

obtained by capacitive division of the pulse amplitude $V_{RD}$ at $\phi_{RD}$ is applied to the base, an inverse bias:

$$\left( V_{cc} + V_{RD} \cdot \frac{C_{ox}}{C_{bc} + C_{be} + C_{ox}} \right)$$

is applied between the base and the collector.

In the present embodiment, in order to completely deplete the carrier accumulating area at the resetting operation and to activate the bipolar transistor at the signal readout, the selections of the impurity concentration and depth of the p-area 3 constituting the base area and the impurity concentration of the n-area 7 are important factors in the design. More specifically, the device is so designed that the base area is not completely depleted only by $V_{cc}$ applied to the collector, but is completely depleted when the base area is given an inverse bias at the resetting. In step junction approximation, the width $X_p$ of the depletion layer extending to the base area is represented by:

$$X_p = \frac{2 \cdot \epsilon_s}{q} \frac{N_D}{N_A} \frac{1}{(N_A + N_D)} (V_{bi} + V_R) \quad (1)$$

$$V_{bi} = \frac{k \cdot T}{q} \ln \frac{N_A \cdot N_D}{n_i^2} \quad (2)$$

wherein $X_p$ is the width of depletion layer in the p-area; $N_A$ is the impurity concentration of the base area 3; $N_D$ is the impurity concentration of the n-area 7; $\epsilon_s$ is the dielectric constant; $n_i$ is the carrier concentration; and $V_R$ is the reverse bias voltage.

For a given $N_D$ of the n-area, the base depth $W_B$ has to satisfy following relations in relation to the impurity concentration $N_A$ of the base area:

$$X_p(V_{cc}) < W_B \leq X_p \left( V_{cc} + V_{RD} \cdot \frac{C_{ox}}{C_{bc} + C_{be}} \right) \quad (3)$$

Also in order to expand this range, it is preferable to increase:

$$\frac{2 \cdot \epsilon_s \cdot N_D}{q \cdot N_A} \times \frac{1}{(N_A + N_D)}$$

thereby increasing the variation of $X_p$ for a given variation of $V_R$.

A condition $N_D \geq N_A$ is preferable for the device design, because a larger process margin can be obtained for given values of the impurity concentration and the depth of the base area.

For achieving complete transfer of the carriers from the base area to the p-substrate, the impurity concentration of the CCD and the thickness of oxide film are also important. The surface potential $\psi_s$ under the CCD in non-stationary state can be represented as follows:

$$V_G - V_{FB} = \psi_s + \frac{1}{C_i} \sqrt{2\epsilon_s q N_D \psi_s} \quad (4)$$

wherein $V_G$ is the gate voltage; $V_{FB}$ is the flat band voltage; $C_i$ is the capacitance of $SiO_2$ per unit area; $\epsilon_s$ is the dielectric constant of Si, and $N_D$ is the impurity concentration under the CCD.

Figure 8A:
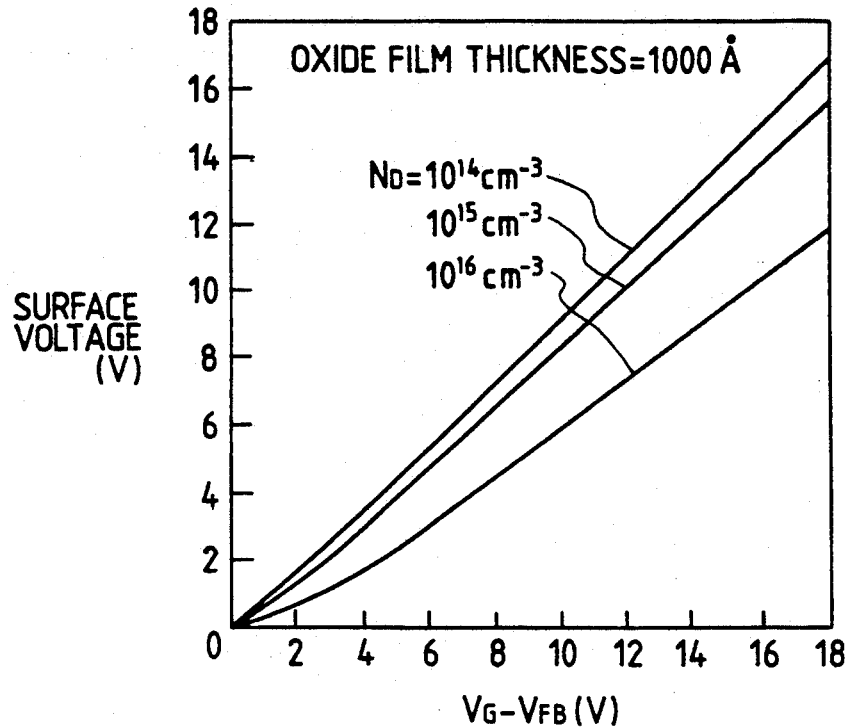
FIGS. 8A and 8B are charts showing the relationship among the surface potential, impurity concentration and oxide film thickness in the CCD area in an embodiment of the present invention.
Figure 8B:
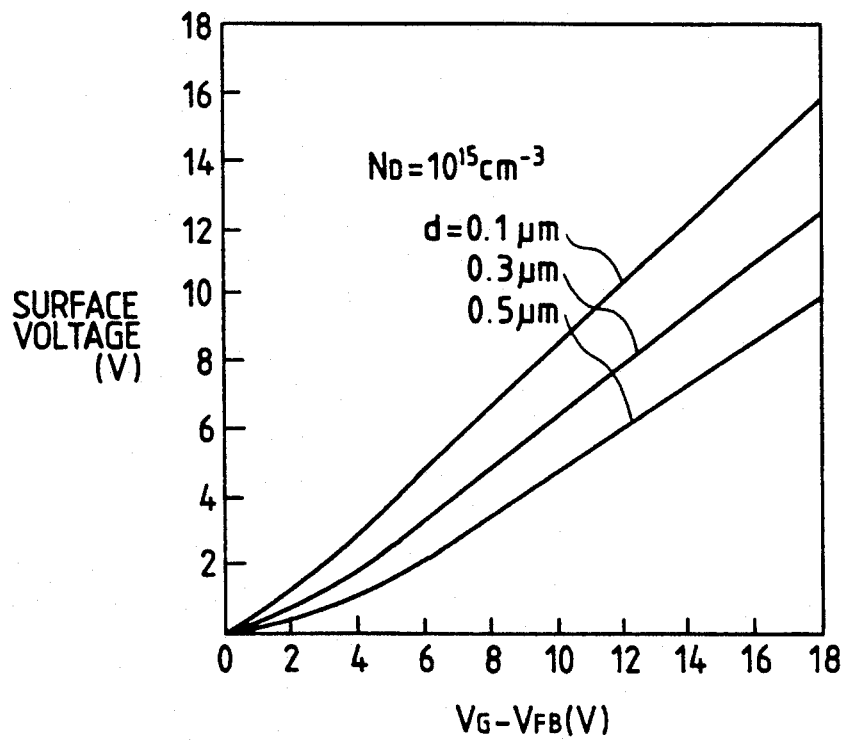

In FIG. 8A shows the surface potenial for an oxide film of 1000 Å and $N_D = 10^{14}$, $10^{15}$ and $10^{16}$ cm$^{-3}$, while FIG. 8B shows the surface potentials for $N_D = 10^{14}$ cm$^{-3}$ and oxide film thicknesses d=0.1, 0.3 and 0.5 μm.

It will be apparent that a condition $V_G - V_{FB} \approx \psi_s$ is reached for an oxide film thickness of 1000 Å or less and an impurity concentration of $10^{15}$ cm$^{-3}$ or less.

The potential distribution as shown in FIG. 7B has to be obtained at the resetting by maintaining said surface potential $\psi_s$ of CCD larger than the voltage:

$$V_{RD} \cdot \frac{C_{ox}}{C_{bc} + C_{be} + C_{ox}}$$

applied to the base area. As will be apparent from FIG. 8A, the potential is very sensitive to the impurity concentration. Utilizing this fact, an uneven distribution of the impurity concentration is created in the CCD, thereby generating an electric field in the lateral direction (FIG. 7B) and causing drift movement of the carriers. Such structure is effective for improving the response speed and the transfer efficiency. Similarly, an area of uneven impurity concentration in the base area for creating an electric field is effective for improving the characteristics.

In the present embodiment, the random noises generated at the signal readout can be experimentally represented as follows:

$$(\Delta V_{RN})^2 = \frac{G_s \cdot q \cdot C_T \cdot V_E}{C_{bc}^2 \cdot h_{FE}} \quad (5)$$

wherein:

$\Delta V_{RN}$: random noise voltage
$G_s$: readout gain from base to load capacitance $C_T$
$C_T$: load capacitance
$V_E$: emitter potential (output potential)
$C_{bc}$: base-collector capacitance (at readout)
$h_{FE}$: current gain.

The signal output S is given by:

$$S = i_p \cdot t_s / C_{bc} \quad (6)$$

wherein $i_p$ is the photo-excited current, and $t_s$ is the accumulation time.

The S/N ratio is given by:

$$\frac{S}{N} = \frac{i_p \cdot t_s}{(G_s \cdot \sqrt{q \cdot C + V_E/h_{FE}})} \quad (7)$$

Thus the improvement in S/N ratio depends upon how $(G_s^2 \cdot G/h_{FE})$ can be reduced. $G_s$ is in a range of 0.5 to 1.0, and basically preferred is a condition $G_s = 1$. For the purpose of circuit designing, $C_T$ is preferably made smaller and $h_{FE}$ is made larger. In the usual homogeneous junction bipolar transistor, $h_{FE} \approx 1000$ is the approximate upper limit. However, in the bipolar transistor with heterogeneous junctions or with an emitter of poly Si/$SiO_2$/monocrystalline Si structure, said under limit can be exceeded. The S/N ratio can be increased to 3.17 times if $h_{FE}$ is made 10 times larger.

In this manner an increase in $h_{FE}$ is most effective for reducing the random noises generated at the signal readout.

Figure 9:
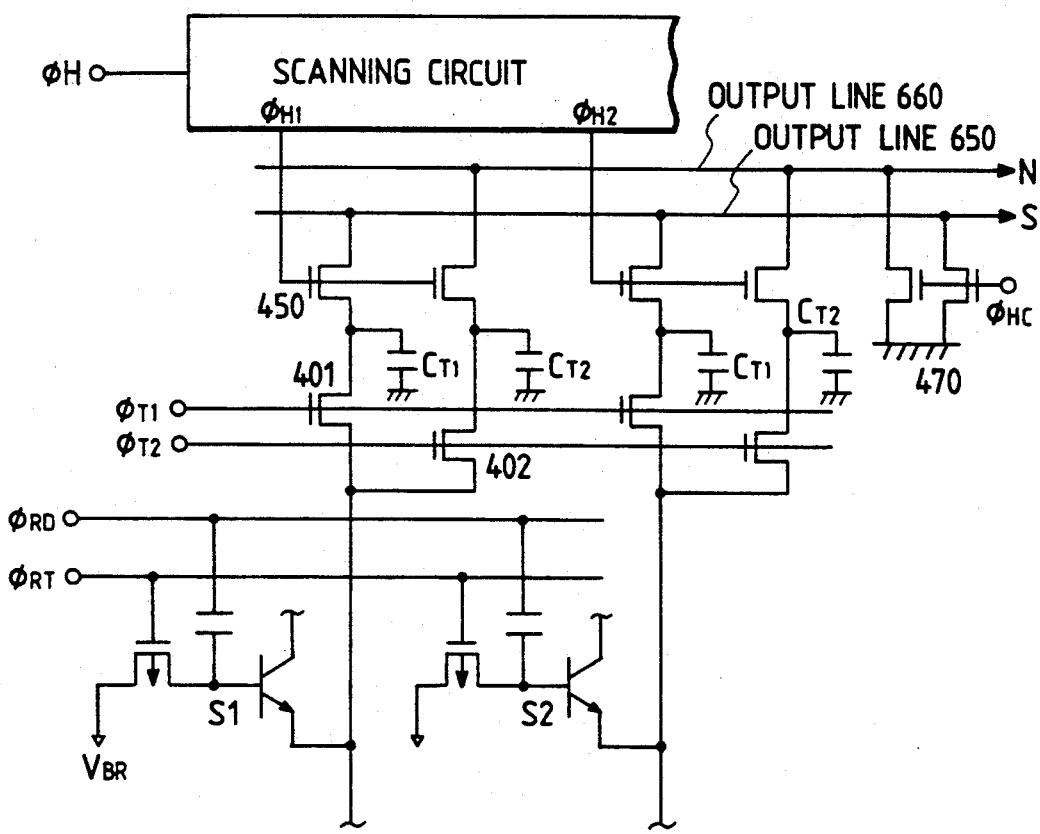
FIG. 9 is a circuit diagram of a first embodiment of the present invention.

In the following there will be explained the correcting method for fixed pattern noises, said method being employable when required. FIG. 9 is an equivalent circuit diagram of a photoelectric converting device with two pixels. Such pixels are provided in a number of several hundred to several thousand in the ordinary line sensor, and are provided also in the vertical direction in a number of several hundred in case of an area sensor. In the structure shown in FIG. 9, two capacitances $CT_1$, $CT_2$ are provided in the readout system.

The capacitance $CT_1$ receives the signal S (photoelectrically converted signal S'+noise N) from the pixels (S1, S2), while the capacitance $CT_2$ receives the noise N from said pixels. Said signal S and noise N are supplied through a transistor 450 which is on-off controlled by driving pulses ($\phi H_1$, $\phi H_2$, ...) from a scanning circuit composed for example of a shift register, in succession to output lines 650, 660. The signal S and noise N from said output lines are supplied to a known differential amplifier (not shown in FIG. 9) for calculating the difference (S−N). In this manner the noise is eliminated from the signal, and there can be obtained the photoelectrically converted signal S' only.

FIG. 10 is a timing chart of the embodiment shown in FIG. 9, wherein T1 is a pixel signal readout period; T2 is a pixel resetting period; T3 is a noise readout period from pixel; and T4 is a period for output of the signal and the noise and for photoelectric conversion or charge accumulation. In the following the function of the device will be explained briefly.

Period T1: The pixels S1, S2 are forward biased between the base and the emitter by a readout pulse $\phi_{RD}$, whereby the photoelectrically converted signal in the base is transferred through a transfer switch 401 to the capacitance $CT_1$. In this state the switch 401 is rendered conductive by a drive pulse $\phi T_1$.

Period T2: The emitter of the pixel is grounded by a switch 400 (not shown in FIG. 9) controlled by a pulse $\phi_{VC}$ as shown in FIG. 5, and the pulse $\phi_{RD}$ is simultaneously given to induce a current between the base and the emitter, thereby effecting transient resetting. Then the base of the pixel is subjected to transfer resetting by a pulse $\phi_{RT}$, whereby the charge scarcely remains in the base.

Period T3: The drive pulse $\phi_{RD}$ is again shifted to positive, thereby forward biasing the pixel, in order to read the noise (offset voltage) from the pixel. In this state the above-mentioned transient resetting switch 400 is rendered off, and the transfer switch 402 is rendered conductive by a pulse supplied to $\phi T_2$.

Consequently the offset voltage, or the noise, of the pixel is transferred to the capacitance $CT_2$.

Period T4: In this period, each pixel is reverse biased to enter the charge accumulation.

Also the signal and the noise accumulated in said capacitances are released in this period.

The signal and the noise in the capacitances $CT_1$, $CT_2$ are supplied, through a switch 450 controlled by pulses from the scanning circuit, to the output lines 650, 660 common to the cells.

At first the signal and the noise of the pixel S1 are released from the capacitances $CT_1$, $CT_2$ in response to $\phi_{H1}$. Then, prior to the signal/noise release for the pixel S2, the output lines 650, 660 are subjected to a resetting of the remaining signals, said resetting is conducted by a switch 470 controlled by a pulse $\phi_{HC}$. Subsequently a next pulse $\phi_{H2}$ is released from the scanning circuit to transfer the signal and the noise of the pixel S2 to the output lines. The signal and the noise from the output lines are subjected to the difference calculation explained above, thereby providing a signal of a high S/N ratio, without the noise component.

The photoelectric converting device of the present embodiment was prepared through the following process:

(1) On the p-substrate 1, there was epitaxially grown the $n^-$-area 2 with an impurity concentration of $10^{14}-10^{16}$ cm$^{-3}$;

(2) The groove T was prepared by dry etching, utilizing a thick oxide film as a mask, and the device isolation area 200 of silicon oxide was prepared by selective oxidation;

(3) After formation of a thin oxide film (200–1000 Å), said groove was filled by polysilicon deposition. After impurity doping, said polysilicon was patterned to form the electrode 9;

(4) The n-area 7 with an impurity concentration of $10^{16}-10^{18}$ cm$^{-3}$ and the p-area with an impurity concentration of $10^{16}-10^{18}$ cm$^{-3}$ were prepared in self-aligned manner, utilizing the electrode 9 and the area 200 as a mask and varying the acceleration voltage of ion implantation;

(5) After the preparation of the oxide film 50, a contact hole for emitter was opened, then polysilicon was deposited, doped with phosphor as an n-type impurity and patterned to simultaneously form the emitter electrode 5 and the electrode 8 for $C_{ox}$. The heat treatment in this process was conducted for about 30 minutes at 850° C. to form a shallow emitter area 4, and an extremely thin oxide film of about 7 Å was stably left between the areas 5 and 4 by the low temperature heat treatment, whereby a poly Si/tunnel SiO$_2$ film/monocrystalline emitter structure was obtained. In this manner $h_{FE}$ of the bipolar transistor can be easily made equal to 5000 or higher;

(6) After the deposition of the insulation layer 201, a through hole is opened, and Al or Al-Si for the electrode was deposited and patterned;

(7) Finally the passivation film 202 was deposited and the holes for pads were opened.

The actual process is somewhat longer because the peripheral circuits include NMOS transistors, but the preparation of such NMOS transistors will not be explained as it is already known.

[2nd embodiment]

In the following there will be explained a 2nd embodiment of the present invention, with reference to FIG. 11.

The basic structure of said 2nd embodiment is same as that of the 1st embodiment, except that, as will be apparent from FIG. 5, a common driving line is used for the PMOS transistor 302 and the capacitance $C_{ox}$ 301, which are controlled by a three-value pulse signal from the terminal $\phi_{RD}$.

The present embodiment reduces the number of patterning steps since the polysilicon wirings 8, 9 (FIG. 4) are made common, thereby enabling device manufacture with a reduced cost.

FIG. 12 is a timing chart showing the function of the present embodiment.

Also in the present embodiment, the base area becomes completely depleted in the resetting operation in a period $t_4-t_1$, so that the random noises can be reduced.

[3rd embodiment]

In the following there will be explained a 3rd embodiment of the present invention, with reference to FIG. 13.

The basic structure of the present embodiment is same as that of the 1st embodiment. The present embodiment is different in that plural emitters are provided in the base area to form plural output lines, thereby realizing signal readouts at different timings, exploiting the feature of the charge-accumulating photosensor.

Figure 13A:
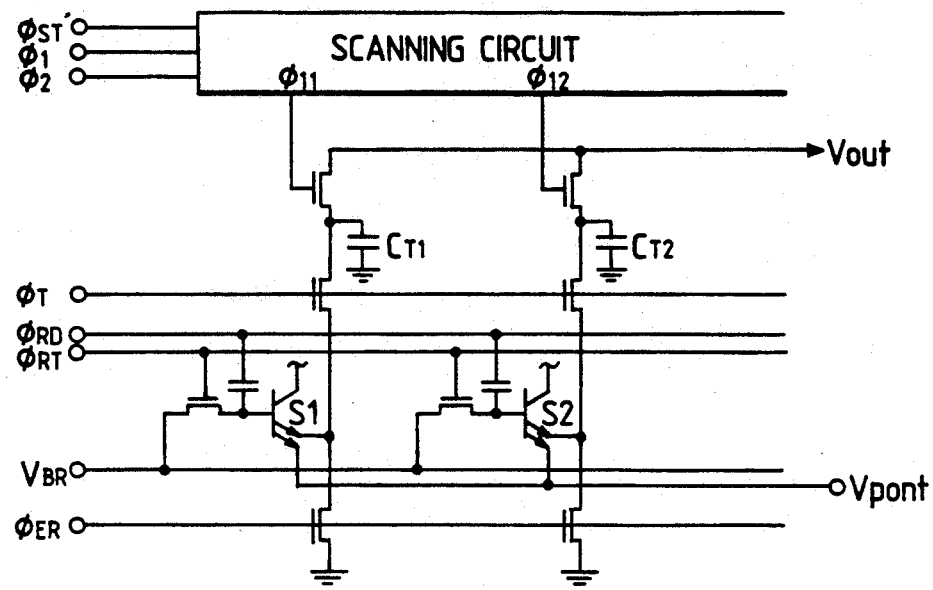
FIGS. 13A and 13B a circuit diagram and a timing chart of a 3rd embodiment of the present invention.
Figure 13B:
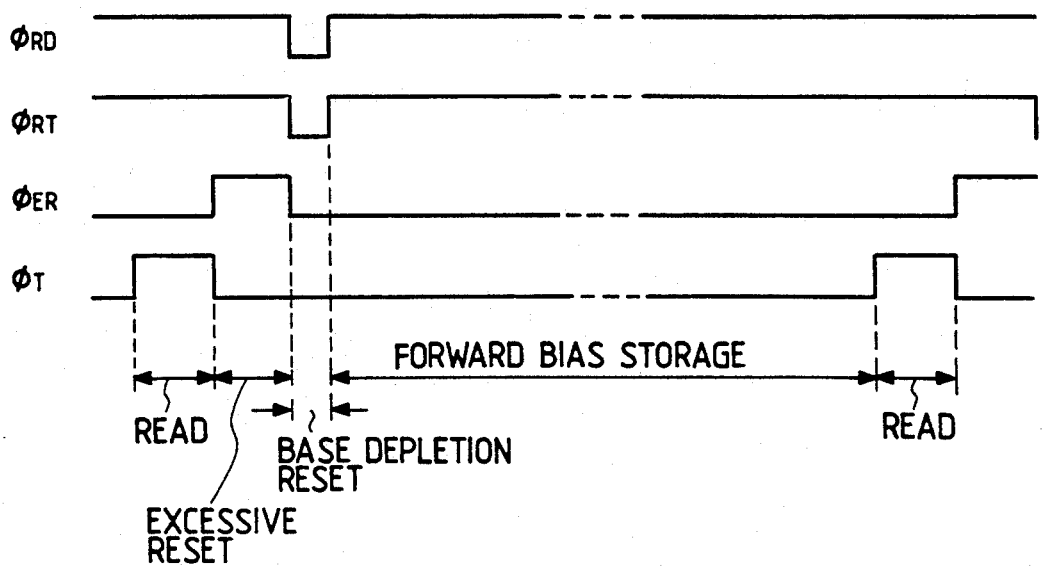

Also the present embodiment is different from the foregoing embodiments in that the bipolar transistor is forward biased between the base and the emitter during the charge accumulating operation, whereby the output signal of a cell receiving the strongest incident light among plural cells can be detected on real-time basis. In FIG. 13A is a circuit diagram and FIG. 13B is a timing chart. The transient resetting, depletion resetting and signal readout to the capacitance $C_T$ are identical with those in the foregoing embodiments. In the present embodiment, after the completion of the depletion resetting of the base, the pulse $\phi_{RD}$ is shifted to the "H" level to bias the bipolar transistor in the forward direction. Since the pulse $\phi_{ER}$, is at the "L" level in this state, the emitter of the bipolar transistor is in the floating state. Since the base and the emitter are both floating and forward biased during the charge accumulation, the potentials thereof vary according to the amount of incident light. Also in the present embodiment, the second emitter in each cell is connected in common for all the pixels, so that the peak output among the entire pixels can be detected in the course of the charge accmulation, in order to control the accumulation time.

The signal of each pixel, transferred to the capacitance $C_T$, is serially released, pixel after pixel, by means of the scanning circuit in the identical manner with the foregoing embodiments.

[4th embodiment]

Figure 14:
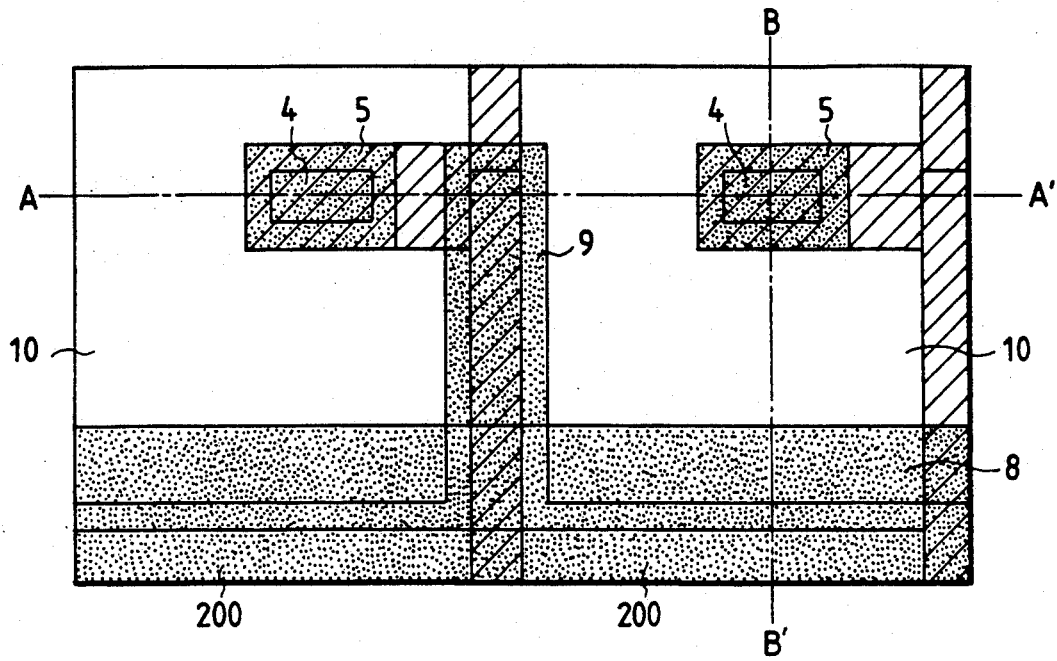
FIG. 14 is a schematic plan view of a photoelectric converting device constituting a 4th embodiment of the present invention.
Figure 15:
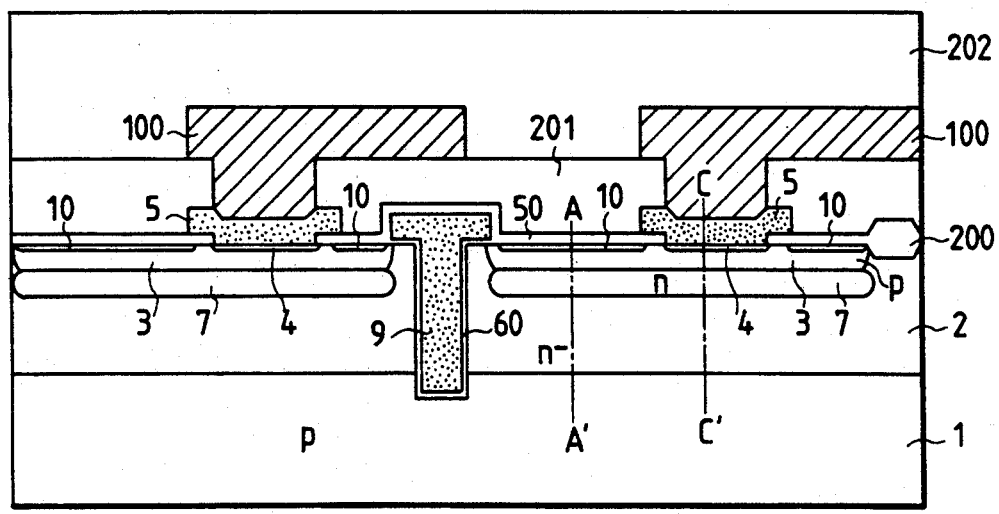
FIG. 15 is a schematic cross-sectional view along a line A-A' in FIG. 14.
Figure 16:
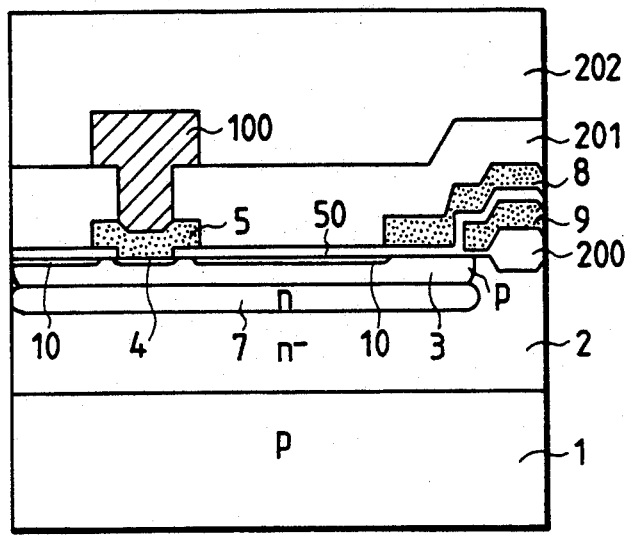
FIG. 16 is a schematic cross-sectional view along a line B-B' in FIG. 14.

FIGS. 14 to 16 are schematic views for explaining the basic structure of a photoelectric converting device, constituting a 4th embodiment of the present invention, in which illustrated are two out of a plurality of photosensor unit cells, wherein FIG. 14 is a plan view of the photosensor cells, FIG. 15 is a cross-sectional view along a line A-A' in FIG. 14, and FIG. 16 is a cross-sectional view along a line B-B' in FIG. 14.

At first explained is the structure of the photosensor cell. On a silicon substrate 1 which is made p-type by doping for example of boron, an n$^-$-area 2 of a low impurity concentration is fomred for example by epitaxial growth. In said n$^-$-area 2, there is formed a p-area 3 constituting the base of a bipolar transistor, as a control electrode area, by doping of an impurity such as boron, through impurity diffusion or ion implantation. In said p-area 3, there is formed an n$^+$-area 4 constituting the emitter of the bipolar transistor, as a main electrode area. Said n$^+$-area 4 can be formed either by As diffusion into monocrystalline silicon from an n$^+$ polycrystalline silicon layer 5 containing an impurity such as As or P with a high concentration, or by impurity diffusion or ion implantation prior to the formation of said layer 5. Between the n$^-$-area 2 and the p-area 3, there is provided an n-area 7 which serves for expanding the depletion layer to the base area. On the p-area 3, across an insulation film 50, there is provided an electrode 8 for controlling the potential of said p-area 3 maintained in the floating state. Also for the purpose of controlling the potential of the n$^-$-area 2 in the elimination of the charge accumulated in the base area, there is provided, in a groove, an electrode 9 for receiving pulses for potential control across an insulation film 60, and said electrode functions as the transfer electrode of a charge-coupled device. The polycrystalline silicon layer 5 serves to release the signal to the exterior, and a wiring 100, composed for example of aluminum (Al), aluminum silicon (Al-Si), aluminum-silicon-copper (Al-Cu-Si), tungsten (W), molybdenum (Mo) or molybdenum silicide (MoSi$_2$), is provided thereon and is electrically connected with other devices to constitute an emitter follower output circuit and a resetting circuit. The photosensor cells are mutually separated by a field insulation area 200 composed for example of SiO$_2$ and a groove area (9, 60). On the main face of the semiconductor substrate, there are further provided an interlayer insulation film 201 and a passivation layer 202. An n-semiconductor area 10, prepared in self-aligned manner utilizing the emitter area 5 and the electrode 9 as a mask, serves to accelerate the expansion of the depletion layer.

Figure 17:
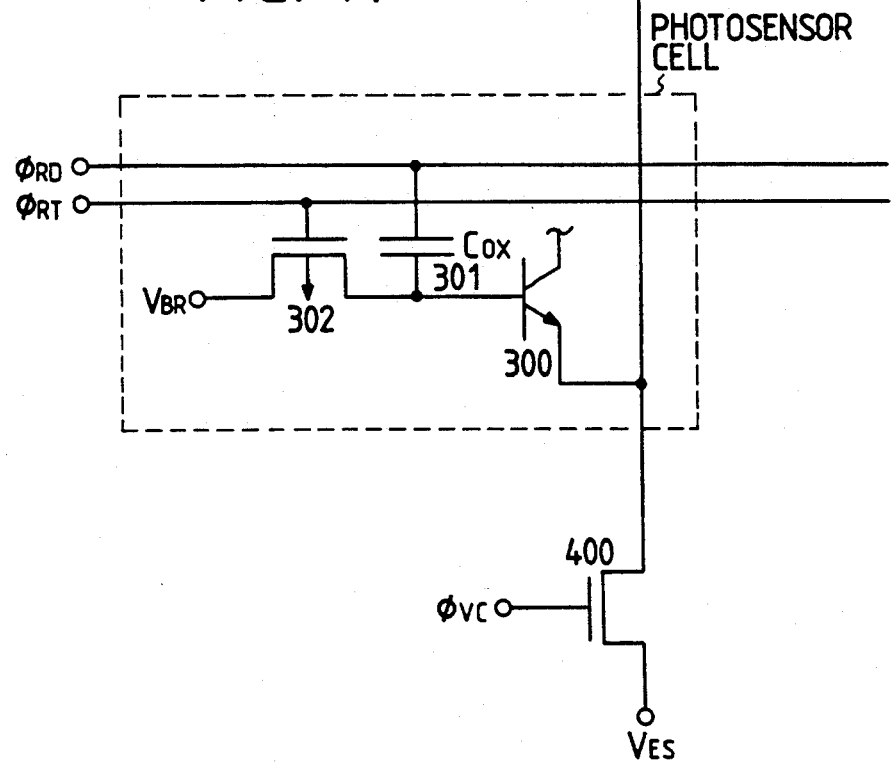
FIG. 17 is a circuit diagram of a pixel of a 4th embodiment.

FIG. 17 shows a pixel circuit and a readout circuit of the photoelectric converting device of the present invention. An area surrounded by a broken line indicates a photosensor pixel cell, consisting of an NPN bipolar transistor 300, a remaining charge transfer CCD 302 for resetting the base of said transistor 300, and a capacitance ($C_{ox}$) 301 formed on said base by the electrode 8 and the insulation film 50. The output circuit consists of a capacitative load $C_T$500 for temporarily accumulating the output voltage of the emitter, a transfer MOS transistor 401 for connecting a vertical output line with said capacitative load $C_T$, and a resetting MOS transistor 400 for resetting the vertical output line and the emitter.

The basic function of said photosensor cell consists of (1) charge accumulation by light reception, (2) signal readout, and (3) resetting.

Figure 18:
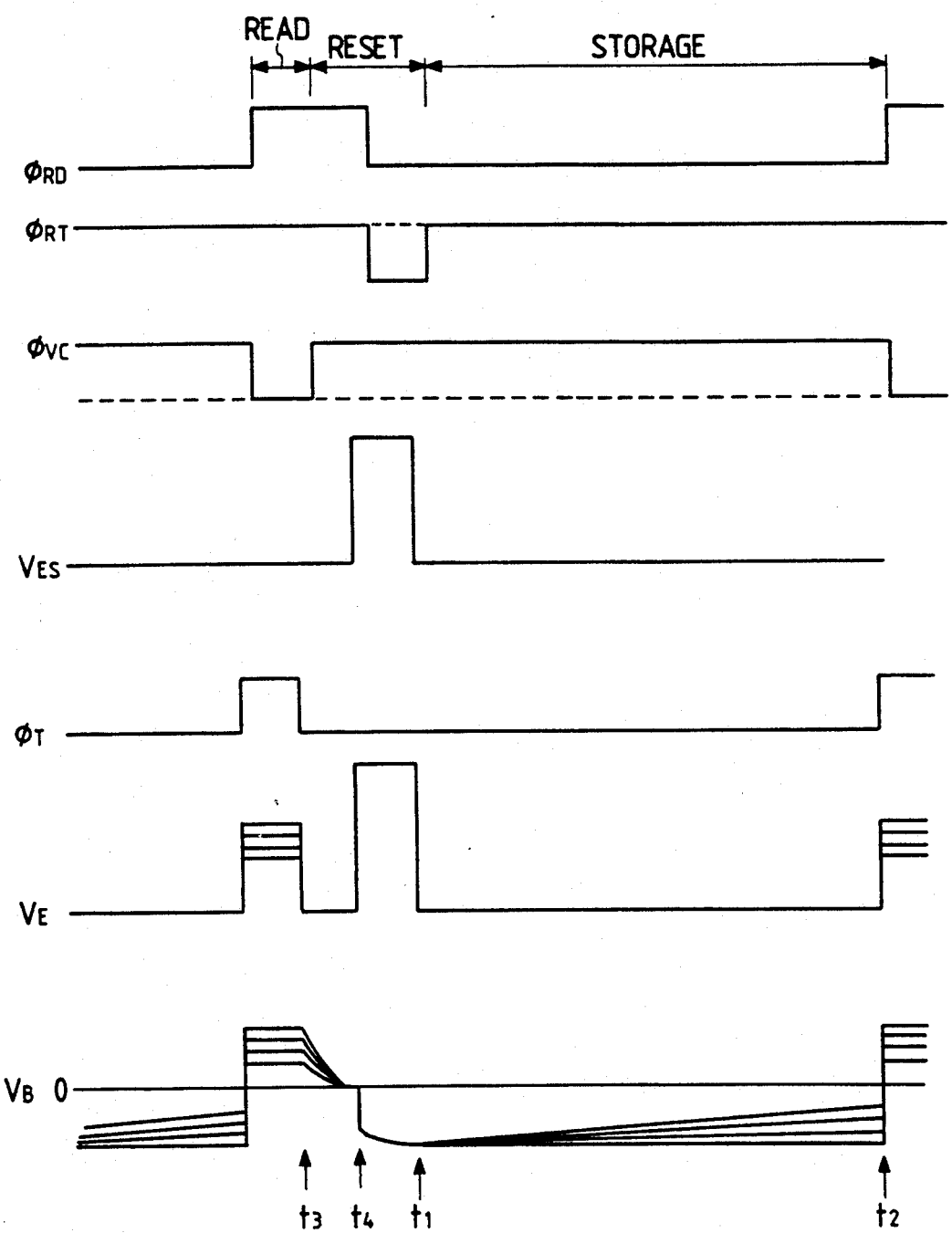
FIG. 18 is a timing chart showing the function of the 4th embodiment shown in FIG. 17.

FIG. 18 shows potential change in various parts in said operations, wherein $\phi_{RD}$, $\phi_{RT}$, $\phi_{VC}$ and $\phi_T$ indicate the potential changes of pulse signals applied to terminals shown in FIG. 17, while $V_E$ and $V_B$ indicate the potential changes in the emitter and base areas of the NPN bipolar transistor constituting the photosensor cell.

Now the function of the photoelectric converting device will be explained with reference to FIGS. 17 and 18.

(1) Charge accumulating operation

The charge accumulating operation is initiated from a time $t_1$ when, after the resetting operation to be explained later, the carriers in the base of the bipolar transistor are completely dissipated by reverse biasing of the base and emitter thereof.

As the positive holes, among the carriers generated by the incident light, are accumulated in the substantially depleted base area, there is formed a neutral area therein, whereby the base potential is elevated.

(2) Signal readout operation $\phi_{VC}$ is turned off to disconnect the emitter from the reference voltage source $V_{ES}$, and a positive pulse is applied to $\phi_T$ to turn on the transfer transistor 401, thereby maintaining the emitter in the floating state. Then a positive pulse is applied to $\phi_{RD}$ to elevate the base potential in the positive side by capacitative coupling through $C_{ox}$ to apply a forward bias between the base and the emitter, whereby the signal readout operation is initiated (time $t_2$). Since the potential of the emitter connected to the capacitative load approaches, by a predetermined value, to the base potential at the end of the signal readout operation at $t_3$, the change in the base potential during the charge accumulating operation appears at the emitter terminal.

(3) Resetting operation

The resetting operation of the photosensor of the present embodiment consists of a combination of at least two operations. In a first resetting operation, $\phi_T$ is turned off while $\phi_{VC}$ is given a positive potential to turn on the transistor, whereby the emitter is fixed at the reference voltage $V_{ES}$. In this state the base potential converges to a fixed value in transient manner ($t_3$-$t_4$).

In a second resetting operation, the positive potential application to $\phi_{RD}$ is terminated to maintain the base at a negative fixed potential, and a negative potential is applied to $\phi_{RT}$ to turn on the PMOS transistor, thereby transferring the remaining carriers from the base to the reference voltage source $V_{BR}$ and thus resetting the base area. Through the aboveexplained operations in the circuit shown in FIGS. 14, 15 and 16, the carriers in the base area are completely transferred toward the reference voltage source $V_{BR}$ whereby the base area is reset to zero potential.

The depleted state may also be achieved in another timing. For example the base area can be brought to the depleted state even without the first resetting operation. In this case the period between $t_3$ and $t_4$ becomes zero.

It is however preferable to add a voltage corresponding to $V_{cc}$ and $V_{th}$ of the MOS transistor to $V_{ES}$ to avoid a potential slack in the emitter, thereby enabling to completely eliminate also the positive holes present under the emitter as the emitter potential approaches to $V_{cc}$.

For achieving a higher sensitivity in the photosensor, it is necessary to increase the S/N ratio by increasing the signal output S and reducing the noises N.

Since the signal output is principally determined by the aperture rate, the reduction of noises is the key factor for improvement.

In the sensor of the type of the present embodiment, the random noises can be roughly classified into those remaining after the resetting and those generated at the signal readout.

The noises remaining at the resetting are determined by the number of majority carriers present at the start of charge accumulation. Depending on the number of carriers remaining in the sensor cell at the resetting, there results a fluctuation, leading to the random noises at the resetting. Consequently, the resetting noises can be reduced to zero by eliminating the carriers at the start of charge accumulation.

More specifically, when the base is inversely biased by turning-off of the voltage supplied through Cox at the end of resetting ($t_4$ in FIG. 18), a potential capable of completely depleting the base area by inverse biasing between the base and the collector, and a potential distribution as shown in FIG. 19 is created, whereby the carriers remaining in the base area are completely transferred to the voltage source $V_{BR}$ through the CCD 302.

In this manner the random noises at the resetting can be reduced to zero.

Figure 19A:
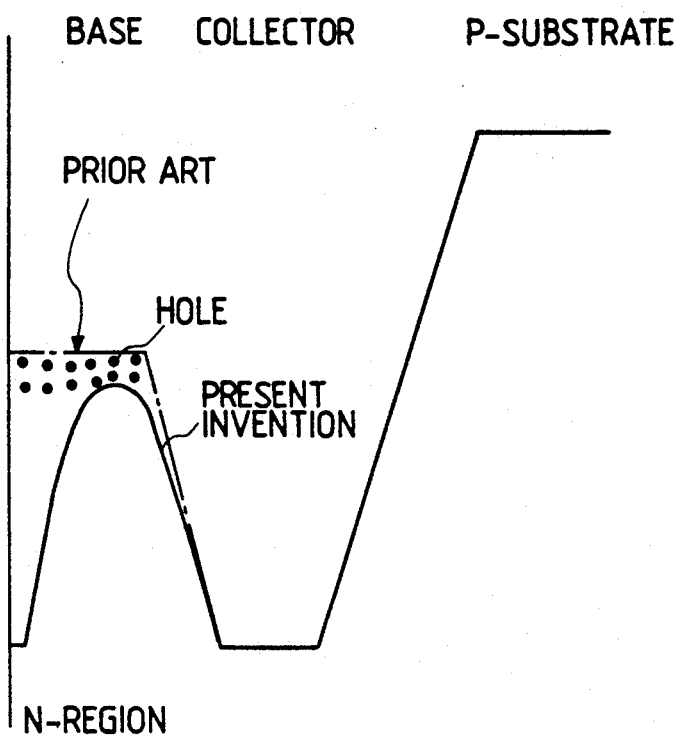
FIGS. 19A and 19B are charts showing te potential distribution in the 4th embodiment of the present invention.
Figure 19B:
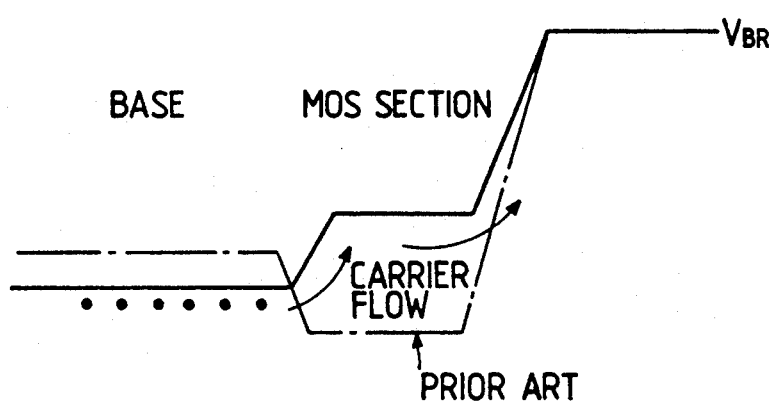

In FIG. 19A indicates the potential distribution along the line A-A' in FIG. 15, while FIG. 19B indicates the transversal potential over the base/PM$\phi$S/p-substrate, wherein a chain line corresponds to the conventional structure and a solid line corresponds to the structure of the present embodiment. In contrast to the conventional structure in which many carriers remain in the neutral area of the base at the resetting operation, the resetting operation of the sensor of the present embodiment does not leave the carriers in the base area, since the base area is substantially depleted. Also the potential distribution along a line C-C' in FIG. 15 is similar to that shown in FIG. 19A.

In the present embodiment, an n-area 10 of a same electrically potential as that of the collector is present for assisting the formation of depletion layer in the base area. In a period from $t_4$ to $t_1$ for completely eliminating the carriers from the base area, the emitter potential is selected at least equal to the sum of the collector potential and the threshold voltage $V_{th}$ of the MOS transistor, so as to maintain the emitter potential $V_{ES}$ same as the potential of the collector. Thus, the potential in the base immediately below the emitter becomes equal to or higher than that of other base areas, whereby the movement of the carriers to the p-substrate is facilitated.

The potential applied to the base in the floating state, being determined by capacitative division by $C_{ox}$, emitter-base capacitance $C_{be}$ and base-collector capacitance $C_{bc}$, is approximately represented by the amplitude of the pulse to $\phi_{RD}$, namely:

$$-V_{RD} \cdot \frac{C_{ox}}{C_{bc} + C_{be} + C_{ox}}.$$

Because of the above-mentioned reverse bias applied to the base area, a reverse bias:

$$\left| V_{CC} + V_{RD} \cdot \frac{C_{ox}}{C_{bc} + C_{be} + C_{ox}} \right|$$

is applied between the base and the collector.

In the present embodiment, the n-area 10 and the emitter area 4 are present also on the base surface, and the base area of the device is preferably so designed that an area positioned under the n-area 10 becomes depleted while an area positioned under the emitter area 4 is not depleted at zero emitter potential but becomes depleted when the emitter is at $V_{cc}$.

The width of the depletion layer of a pn junction can be represented, in a step junction approximation, as follows:

$$W^2 = \frac{2E_s}{q} \cdot \frac{N_A + N_D}{N_A \cdot N_D} (V_{bi} + V_R) \quad (8)$$

$$V_{bi} = \frac{kT}{q} \ln \frac{N_A \cdot N_D}{n_i^2} \quad (9)$$

wherein:
W: width of depletion layer
$N_A$: impurity concentration of p-area
$N_D$: impurity concentration of n-area
$E_s$: dielectric constant
$n_i$: true carrier concentration
$V_R$: reverse bias voltage.

Since $N_D >> N_A$ in case of n+p, there is obtained an approximation:

$$W^2 = \frac{2E_s}{q} \cdot \frac{1}{N_A} (V_{bi} + V_R) \quad (10)$$

Figure 20:
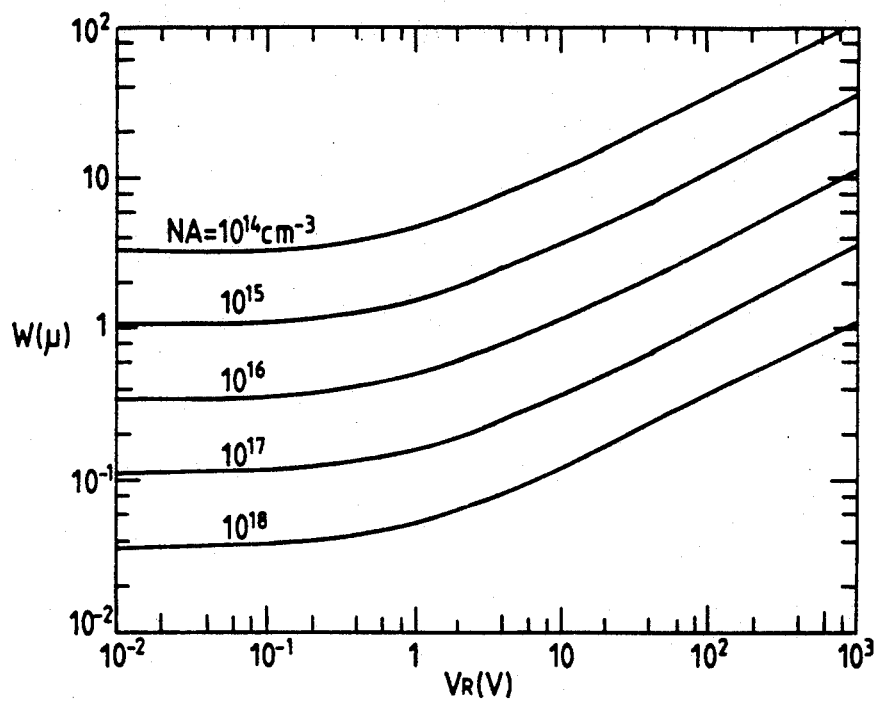
FIG. 20 is a chart showing the relationship among the impurity concentration, base layer thickness and bias voltage.

FIG. 20 shows the relationship between $V_R$ and W in Si, with $N_A$ taken as a parameter. In the device design with the base of the present embodiment, the base thickness can be 0.2 μm or less, for example for $V_R=5$ V and an impurity concentration of the base of $10^{17}$ cm$^{-3}$. The lower limit of the base thickness has to be at least equal to the value on y-axis in FIG. 20 for each impurity concentration, in order to prevent expansion of the depletion layer at the zero emitter potential. More specifically, in case of $V_{cc}=5$ V, the base width is preferably selected to satisfy a condition W(0 V)<$W_b$<W($V_{cc}=5$ V). Furthermore, in the device designing, the horizontal distance between the emitter area 4 and the n-area 10 is also important, because an excessively small distance causes a current leak between the areas 4 and 10. The depletion layers have to be separated at the zero emitter potential but be mutually connected when the emitter potential is $V_{cc}$.

In case of $V_R = V_{cc}$ in the equation (8), it is important that the distance between the areas 4 and 10 does not exceed $2W(V_{cc})$ and is not less than $W(V_{cc})$.

For achieving complete transfer of the carriers from the base area to the p-substrate, the impurity concentration of the CCD and the thickness of oxide film are also important. The surface potential $\psi_s$ under the CCD in unstationary state can be represented as follows:

$$V_G - V_{FB} = \psi_s + \frac{1}{C_i}\sqrt{2\epsilon_s q N_D \psi_s} \quad (11)$$

wherein $V_G$ is the gate voltage; $V_{FB}$ is the flat band voltage; $C_i$ is the capacitance of $SiO_2$ per unit area; $\epsilon_s$ is the dielectric constant of Si; and $N_D$ is the impurity concentration under the CCD.

It will be apparent from FIG. 8 that a condition $V_G - V_{FB} \approx \psi_s$ is reached for an oxide film thickness of 1000 Å or less and an impurity concentration of $10^{15}$ cm$^{-3}$ or less.

The potential distribution as shown in FIG. 19B has to be obtained at the resetting, by maintaining said surface potential $\psi_s$ of CCD larger than the voltage:

$$V_{RD} \cdot \frac{C_{ox}}{C_{bc} + C_{be} + C_{ox}}$$

applied to the base area. As will be apparent from FIG. 8A, the potential is very sensitive to the impurity concentration. Utilizing this fact, an uneven distribution of the impurity concentration is created in the CCD, thereby generating an electric field in the lateral direction (FIG. 19B) and causing drift movement of the carriers. Such structure is effective for improving the response speed and the transfer efficiency. Similarly an area of uneven impurity concentration in the base area for creating an electric field is effective for improving the characteristics.

In the present embodiment, the random noises generated at the signal readout can be experimentally represented as follows:

$$(\Delta V_{RN})^2 = \frac{G_s \cdot q \cdot C_T \cdot V_E}{C_{bc}^2 \cdot h_{FE}} \quad (12)$$

wherein:
$\Delta V_{RN}$: random noise voltage
$G_s$: readout gain from base to load capacitance $C_T$
$C_T$: load capacitance
$V_E$: emitter potential (output potential)
$C_{bc}$: base-collector capacitance (at readout)
$h_{FE}$: current gain.
The signal output S is given by:

$$S = i_p \cdot t_s / C_{bc} \quad (13)$$

wherein $i_p$ is the photo-excited current, and $t_s$ is the accumulation time.
The S/N ratio is given by:

$$\frac{S}{N} = \frac{i_p \cdot t_s}{(G_s \cdot \sqrt{q \cdot C + V_E/h_{FE}})} \quad (14)$$

Thus the improvement in S/N ratio depends upon how $(G_s^2 \cdot G/h_{FE})$ can be reduced. $G_s$ is in a range of 0.5 to 1.0, and basically preferred is a condition $G_s = 1$. For the purpose of circuit designing, $C_T$ is preferably made smaller and $h_{FE}$ is made larger. In the usual homogeneous junction bipolar transistor, $h_{FE} \approx 1000$ is the approximate upper limit. However, in the bipolar transistor with heterogeneous junctions or with an emitter of poly-Si/SiO$_2$/monocrystalline Si structure, said upper limit can be exceeded. The S/N ratio can be increased to 3.17 times if $h_{FE}$ is made 10 times larger.

In this manner an increase in $h_{FE}$ is most effective for reducing the random noises generated at the signal readout.

The correction method for the fixed pattern noises, applicable to the present embodiment, is same as that in the first embodiment, explained already in relation to FIGS. 9 and 10.

The photoelectric converting device of the present embodiment was prepared through the following process:

(1) On the p-substrate 1, there was epitaxially grown the n$^-$-area 2 with an impurity concentration of $10^{14}$–$10^{16}$ cm$^{-3}$;

(2) The groove T was prepared by dry etching, utilizing a thick oxide film as a mask, and the device isolation area 200 of silicon oxide was prepared by selective oxidation;

(3) After formation of a thin oxide film (200–1000 Å), said groove was filled by polysilicon deposition. After impurity doping, said polysilicon was patterned to form the electrode 9;

(4) The n-area 7 with an impurity concentration of $10^{16}$–$10^{18}$ cm$^{-3}$ and the p-area 3 with an impurity concentration of $10^{16}$–$10^{18}$ cm$^{-3}$ were prepared in self-aligned manner, utilizing the electrode 9 and the area 200 as a mask and varying the acceleration voltage of ion implantation;

(5) After the preparation of the oxide film 50, a contact hole for emitter was opened, then polysilicon was deposited, doped with phosphor as an n-type impurity and patterned to simultaneously form the emitter electrode 5 and the electrode 8 for $C_{ox}$. The heat treatment in this process was conducted for about 30 minutes at 850° C. to form a shallow emitter area 4, and an extremely thin oxide film of about 7 Å was stably left between the areas 5 and 4 by the low temperature heat treatment, whereby a polySi/tunnel SiO$_2$ film/monocrystalline emitter structure was obtained. In this manner $h_{FE}$ of the bipolar transistor can be easily made equal to 5000 or higher;

(6) After the deposition of the insulation layer 201, a through hole is opened, and Al or Al-Si for the electrode was depositioned and patterned;

(7) Finally the passivation film 202 was deposited and the holes for pads were opened.

[5th embodiment]

Figure 11:
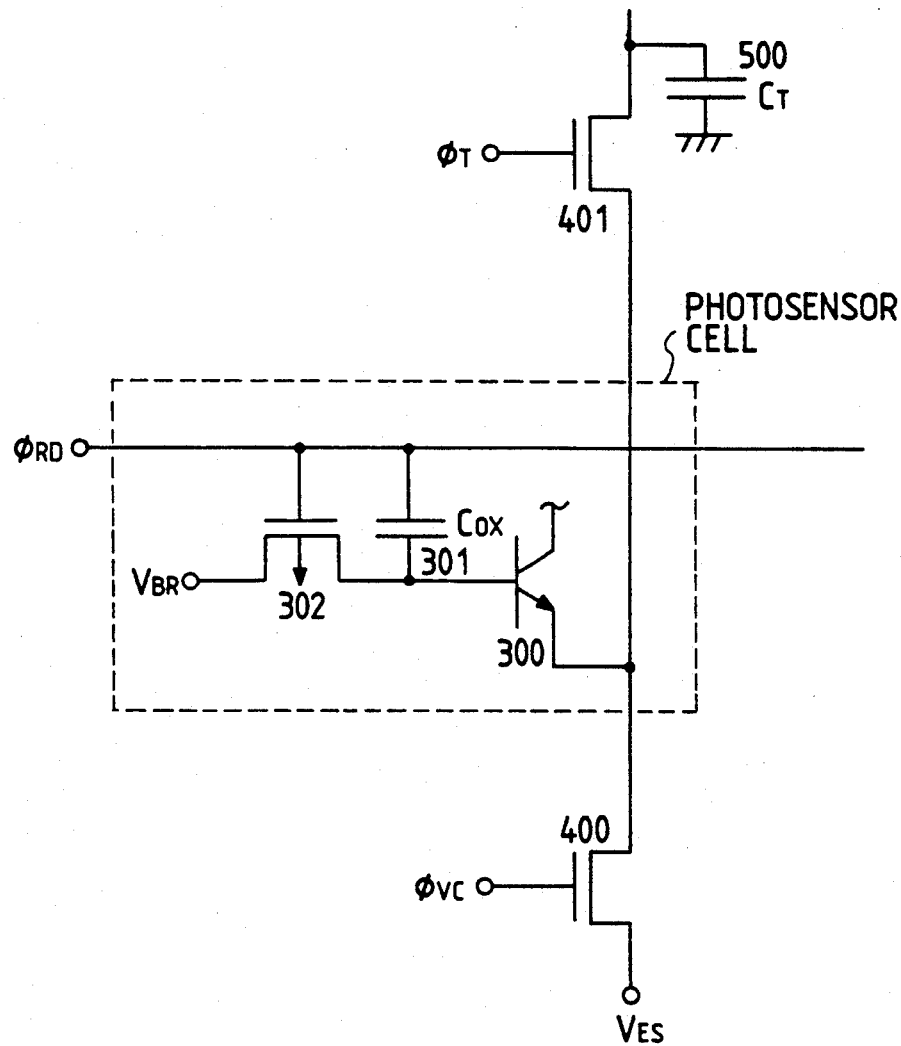
FIG. 11 is a circuit diagram of a pixel of a 2nd embodiment of the present invention.

This embodiment is same, in the basic structure, as the foregoing 4th embodiment, except that a common driving lines is used for the CCD 302 and the capacitance $C_{ox}$ 301, which are controlled by a three-value pulse signal from the terminal $\phi_{RD}$, as in the structure shown in FIG. 11.

The present embodiment reduces the number of patterning steps since the polysilicon wirings 8, 9 are made common, thereby enabling device manufacture with a reduced cost.

The functions of the present embodiment are conducted with the timings shown in FIG. 12.

Also in the present embodiment, the base area becomes completely depleted in the resetting operation in a period $t_4$-$t_1$, so that the random noises can be reduced.

[6th embodiment]

The present embodiment is same, in basic structure, as the aforementioned 4th embodiment, but is different in that plural emitters are provided in the base area to form plural output lines, thereby realizing signal readouts at different timings, exploiting the feature of the charge-accumulating photosensor.

Also the present embodiment is different from the foregoing embodiments in that the bipolar transistor is forward biased between the base and the emitter during the charge accumulating operation, whereby the output signal of a cell receiving the strongest incident light among plural cells can be detected on real-time basis. The circuit structure and the function timings are same as those shown in FIG. 13. Also the transient resetting, depletion resetting and signal readout to the capacitance $C_T$ are identical with those in the foregoing embodiments. In the present embodiment, after the completion of the depletion resetting of the base, the pulse $\phi_{RD}$ is shifted to the "H" level to bias the bipolar transistor in the forward direction. Since the pulse $\phi_{EB}$ is at the "L" level in this state, the emitter of the bipolar transistor is in the floating state. Since the base and the emitter are both floating and forward biased during the charge accumulation, the potentials thereof vary according to the amount of incident light. Also in the present embodiment, the second emitter in each cell is connected in common for all the pixels, so that the peak output among the entire pixels can be detected in the course of the charge accumulation, in order to control the accumulation time.

The signal of each pixel, transferred to the capacitance $C_T$, is serially released, pixel after pixel, by means of the scanning circuit in the identical manner with the foregoing embodiments.

[7th embodiment]

The photoelectric converting device of the present embodiment is provided with a photoelectric conversion cell including at least a control electrode area of a first conductive type constituting an accumulating area for the carriers generated by light energy, and first and second main electrode areas of a second conductive type different from said first conductive type, and is featured by a fact that the resetting operation is conducted at least by a first resetting in which said control electrode area is maintained at a predetermined potential while said first main electrode area is maintained at a higher potential than in said control electrode area thereby being maintained at a high impedance state, whereby the control electrode area positioned under said first main electrode area is depleted, and a second resetting in which said first main electrode area is maintained at a lower potential than in said control electrode area thereby being maintained at a low impedance state after said first resetting and then said first main electrode area is maintained in a floating state.

According to the present embodiment, at first the first resetting operation maintains the control electrode area at a predetermined potential and also maintains the first main electrode area at a higher potential than in said control electrode area, thereby maintaining the first main electrode area in a high impedance state, whereby the control electrode area positioned under the first main electrode area is depleted and the carriers accumulated in the control electrode area are completed eliminated. Said first resetting can reduce the influence of random noises, as the carriers in the control electrode area are completely removed.

Then the second resetting maintains the first main electrode area at a lower potential than in said control electrode area, thereby maintaining said first main electrode area in a low impedance state and creating a forward bias state, and then maintains said first main electrode area in a floating state. Said second resetting creates a forward bias state instead of the reverse bias state in the first resetting, whereby the potential of the first main electrode area is so set as to form a diffusion potential with the control electrode area, whereby the charge accumulating state is entered.

In the following the 7th embodiment will be explained in detail with reference to the attached drawings.

Figure 21:
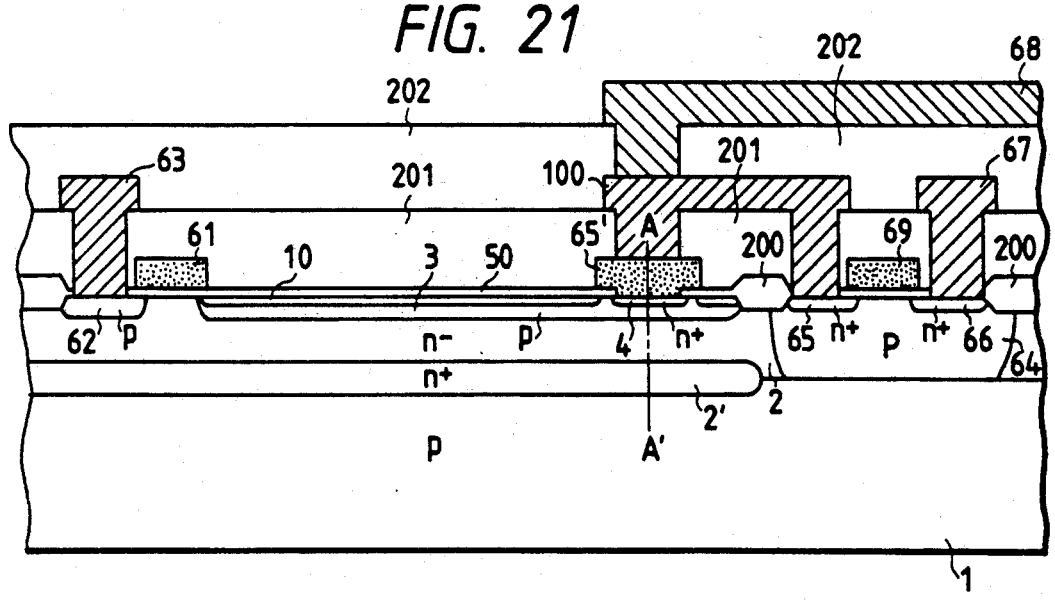
FIG. 21 if a schematic cross-sectional view of a photoelectric converting device constituting a 7th embodiment of the present invention.

FIG. 21 is a cross-sectional view of a photosensor cell constituting the photoelectric converting device of the present embodiment.

In FIG. 21 there are shown a silicon substrate 1 made p-type by doping for example with boron (B); an n+ buried area 2' formed on said silicon substrate 1; an n⁻-area 2 of a low impurity concentration, formed for example by epitaxial growth on the silicon substrate 1 and the n+-buried area 2'; a p-area 3 formed by doping an impurity such as boron by impurity diffusion or ion implantation in said n⁻-area 2 and constituting the base, serving as the control electrode area, of a bipolar transistor; n+-polycrystalline Si layers 65', 69, 61 containing an impurity such as As or P at a high concentration; an n+-area 4 formed by impurity diffusion from the polycrystalline Si layer 65' into the monocrystalline silicon, or by ion implantation or impurity diffusion from another diffusion source prior to the formation of the polycrystalline Si layer 65', and constituting the emitter, serving as the first main electrode area, of the bipolar transistor; a p-area 64 constituting the channel of an NMOS transistor; n+-areas 65, 66 constituting the source and drain thereof; an n-area 10 positioned in the vicinity of the surface of the base; metal wirings 100, 68; and dielectric area 50, 200, 201, 202 serving as protective film, device isolation area and interlayer insulation film. The photosensor cell is composed of the elements mentioned above.

In said photosensor cell, a bipolar transistor is composed of the area 4 as the emitter, the area 3 as the base and the areas 2, 2' as the collector serving also as the second main electrode area. Also an NMOS transistor is composed of the area 69 as the gate, the areas 65, 66 as the source/drain and the area 69 as the channel forming area, and a PMOS transistor is composed of the area 61 as the gate, the areas 3, 62 as the source/drain, and the area 2 as the channel forming area.

Figure 22:
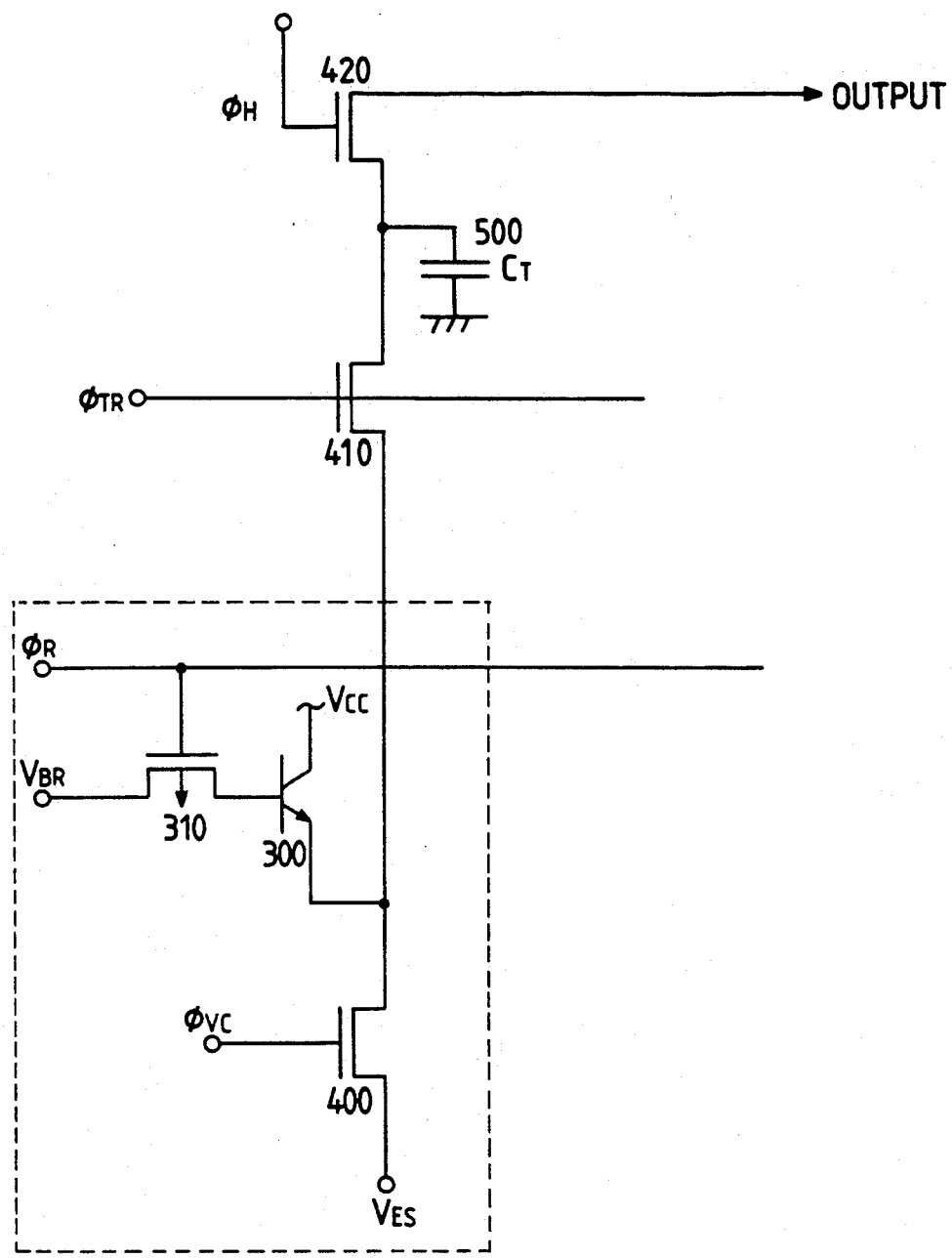
FIG. 22 is a circuit diagram of the 7th embodiment of the present invention.

FIG. 22 is a circuit diagram of the photoelectric converting device of the present embodiment, showing a pixel and a part of the signal readout circuit.

In FIG. 22, the area surrounded by a broken line is the equivalent circuit of the photoelectric converting device shown in FIG. 21, consisting of an NPN bipolar transistor 300, a complete charge transfer PMOS transistor 310 for base resetting, and a switching NMOS transistor 400 for emitter potential control. There are also shown signal readout NMOS transistors 410, 420, and a charge readout capacitance $C_T$ 500.

In the following the function of the photoelectric converting device explained above will be explained with reference to FIGS. 22 to 25.

The basic function of said photosensor cell consists of (1) charge accumulation by light reception, (2) signal readout, and (3) resetting.

Figure 23:
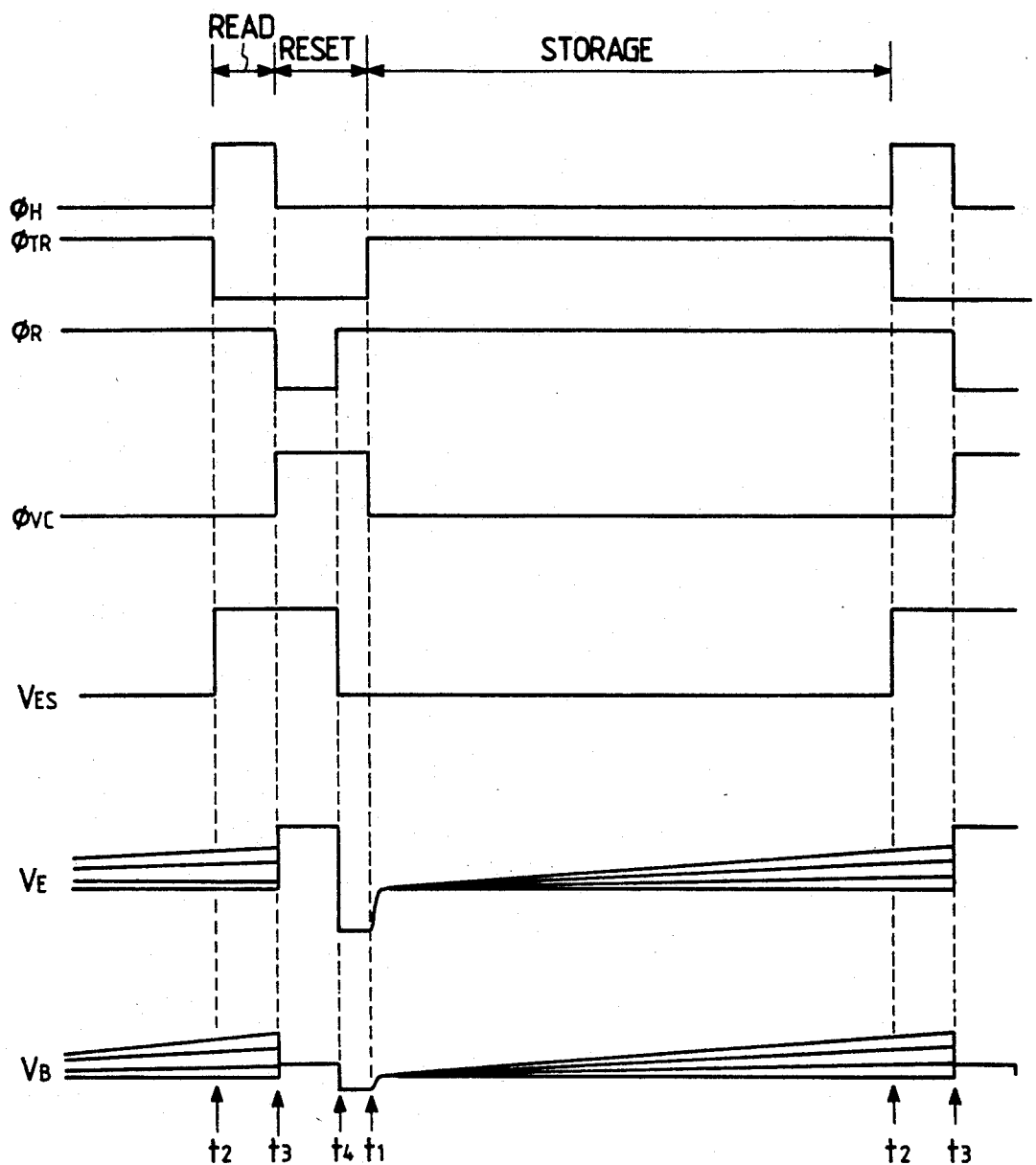
FIG. 23 is a timing chart showing the function of the 7th embodiment shown in FIG. 22.

FIG. 23 shows potential change in various parts in said operations, wherein $\phi_H$, $\phi_{TR}$, $\phi_R$, $\phi_{VC}$ and $V_{ES}$ indicates the potential changes of pulse signals applied to various parts in FIG. 22, while $V_E$ and $V_B$ indicate the potential changes in the emitter and base areas of the NPN transistor constituting the photosensor cell.

Figure 24:
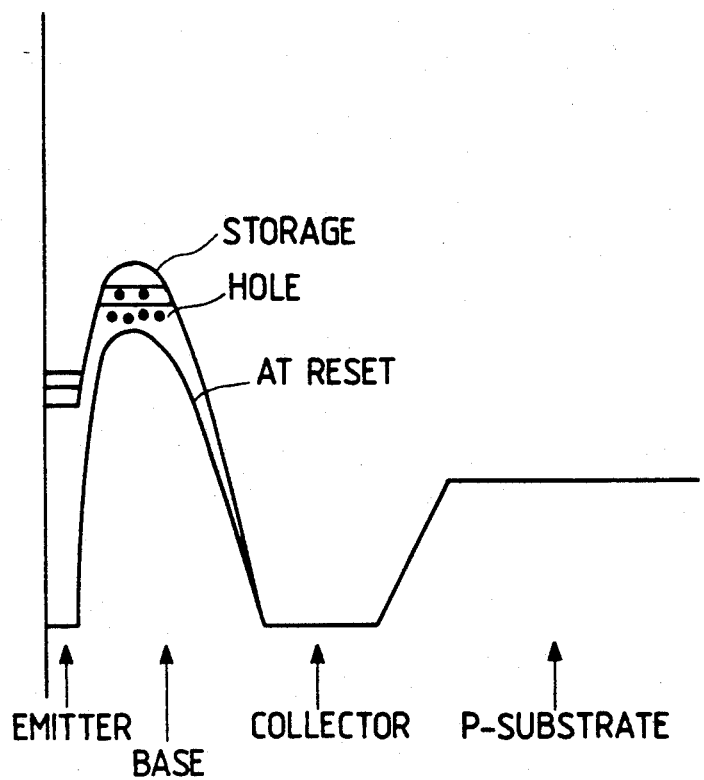
FIGS. 24 and 25 are schematic charts showing the potential distribution of the 7th embodiment of the present invention.
Figure 25:
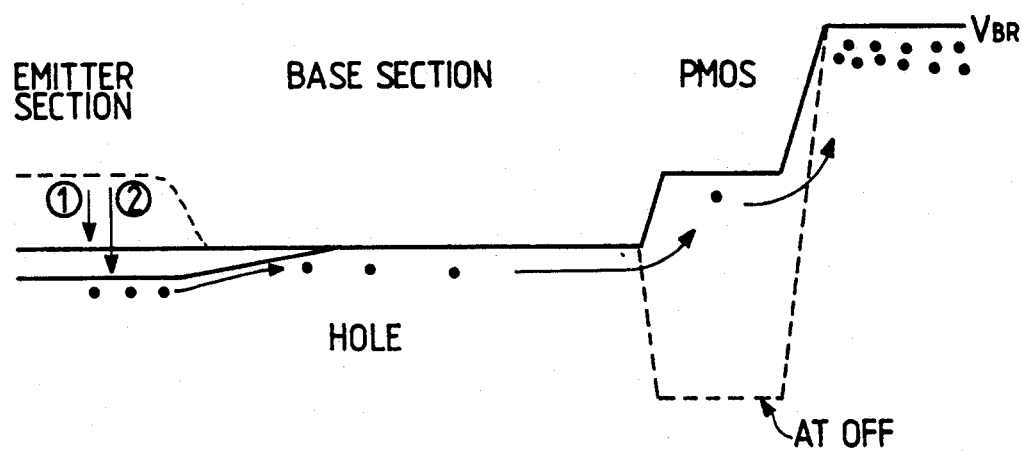

FIG. 24 indicates the potential distribution along a line A-A' in FIG. 21, and FIG. 25 indicates the lateral potential distribution over the area 4 and the resetting PMOS transistor in FIG. 21.

FIG. 24 also schematically shows the potential changes in the base and emitter areas immediately after the resetting and in the charge accumulation. FIG. 25 schematically shows the potential distribution at the resetting, illustrating the flow of the accumulated carriers (positive holes) through the complete transfer gate.

(1) Charge accumulating operation ($t_1$-$t_2$)

As shown in FIG. 23, the charge accumulating operation starts from a time $t_1$ when, after the resetting operation to be explained later, the carriers in the base area are completely dissipated. In the present embodiment, since the charge accumulation is conducted with a forward bias between the emitter and the base, the carrier accumulation in the base area elevates the base potential, with a simultaneous elevation of the emitter potential, whereby the capacitance $C_T$ is charged. Stated differently, a signal corresponding to the base potential is always supplied to the capacitance $C_T$. In this operation, $\phi_{TR}$ is at the high level state whereby the NMOS transistor 410 alone is turned on, while the charge transfer PMOS transistor 310, switching NMOS transistor 400 and NMOS transistor 420 are turned off. The emitter and the base of the NPN bipolar transistor 300 are both in the floating state.

(2) Signal readout operation ($t_2$-$t_3$)

As the charge is transferred from the photosensor cell to the capacitance $C_T$ in the course of charge accumulation, $\phi_{TR}$ is shifted to the low level state to turn off the NMOS transistor 410 and $\phi_H$ is shifted to the high level state to turn on the NMOS transistor 420, whereby the charge is transferred from the capacitance $C_T$ to the amplifier. The capacitance $C_T$ is preferably reset thereafter.

(3) Resetting operation ($t_3$-$t_4$-$t_1$)

The resetting of the photosensor of the present embodiment consists of a combination of two operations.

The first resetting, conducted in a period from $t_3$ to $t_4$, shifts $\phi_{VC}$ to the high level state to turn on the switching NMOS transistor 400, thereby shifting the emitter potential to the positive side and elevating the potential of a part of the base area positioned under the emitter area as shown in FIG. 25 higher than the potential of the other depleted part of the base area, thus enabling the movement of the positive holes. Also $\phi_R$ is shifted to the low level state, thereby maintaining the potential of the lower part of the CCD gate lower than that of the base area. Thus all the carriers (positive holes) are completely eliminated from the base area, as shown in FIG. 25.

The second resetting, conducted in a period from $t_4$ to $t_1$, shifts $\phi_R$ to the high level state to trun off the CCD, thereby disconnecting the base and setting the emitter potential ($V_{ES}$) at the negative side. Thus a forward biasing is realized between the emitter and the base. Thereafter $\phi_{VC}$ is shifted to the low level state to turn off the switching NMOS transistor 400, whereby the emitter is also maintained in the floating state and the resetting operation is thus completed. When $\phi_{VC}$ is shifted to the low level state at $t_1$, the emitter potential is lower than the base potential, so that an electron current flows from the emitter to the collector through the base.

Since the emitter is floating in this state, the emitter potential is elevated almost to a value constituting a diffusion potential with the base potential, and the second resetting is thus completed.

The width of the depletion layer of an n-p junction can be represented, in step junction approximation, by the following relation:

$$W = \sqrt{\frac{2E_s}{q} \frac{N_A + N_D}{N_A \cdot N_D} (V_{bi} + V_R)} \quad (15)$$

$$V_{bi} = \frac{kT}{q} \ln \frac{N_A \cdot N_D}{n_i^2} \quad (16)$$

wherein W is the width of depletion layer; $N_A$ is impurity concentration of p-area; $N_D$ is impurity concentration of n-area; $E_s$ is dielectric constant; $n_i$ is true carrier concentration; and $V_R$ is reverse bias voltage.

Since $N_D >> N_A$ in case of n+p, there is obtained an approximation:

$$W = \sqrt{\frac{2E_s}{q} \frac{1}{N_A} (V_{bi} + V_R)} \quad (17)$$

The relationship between $V_R$ and W in Si, with $N_A$ taken as a parameter is shown in FIG. 20. For example, for $V_R = 5$ V and a base impurity concentration of $10^{17}$ cm$^{-3}$, the base thickness can be 0.2 $\mu$m or less. The lower limit of the base thickness has to be at least equal to the value on the y-axis in FIG. 20 for each impurity concentration, in order to prevent expansion of the depletion layer at the zero emtiter potential.

Furthermore, in the device design, the horizontal distance between the emitter area 4 and the n-area 10 is also important, because an excessively small distance causes a current leak between the areas 4 and 10. It is necessary that, at the zero emitter potential, the depletion layers are mutually separated with a neutral area remaining in the base, and, with the emitter potential at $V_{cc}$, the depletion layers are in mutual contact and in a punch-through state. In case of $V_R = V_{cc}$ in the equation (15), it is important that the distance between the areas 4 and 10 does not exceed $2W(V_{cc})$ and is not less than $W(V_{cc})$.

In the present photosensor, the random noises generated at the signal readout can be experimentally represented as follows:

$$(\Delta V_{RN})^2 = G_s^2 \cdot q C_T V_E / (C_{bc}^2 h_{FE}) \quad (18)$$

wherein:
$\Delta V_{RN}$: random noise voltage
$G_s$: readout gain from base to load capacitance $C_T$
$C_T$: load capacitance
$V_E$: emitter potential (output potential)
$C_{bc}$: base-collector capacitance (at readout)
$h_{FE}$: current gain.

The signal output S is given by:

$$S = i_p \cdot t_s / C_{bc} \quad (19)$$

wherein $i_p$ is the photo-excited current, and $t_s$ is the accumulation time.

The S/N ratio is given by:

$$S/N = i_p \cdot t_s/(G_s \cdot \sqrt{qC_T V_E/h_{FE}}) \quad (20)$$

Thus, the improvement in S/N ratio depends on how $(G_s^2 \cdot C_T/h_{FE})$ can be reduced. $G_s$ is preferably in a range from 0.5 to 1.0, and $G_s=1$ is basically desirable. For the purpose of circuit designing, $C_T$ is preferably made smaller and $h_{FE}$ is made larger. In the usual homogeneous junction bipolar transistor, $h_{FE} \approx 1000$ is the approximate upper limit. However, in the bipolar transistor with heterogeneous junctions or with a structure of poly-Si/SiO$_2$/monocrystalline Si, said upper limit can be exceeded. The S/N ratio can be increased to 3.17 times if $h_{FE}$ is made 10 times larger. In this manner an increase in $h_{FE}$ is most effective for reducing the random noises generated at the signal readout.

In the following there will be explaiend the correcting method for fixed pattern noises, said method being employable when required.

Figure 26:
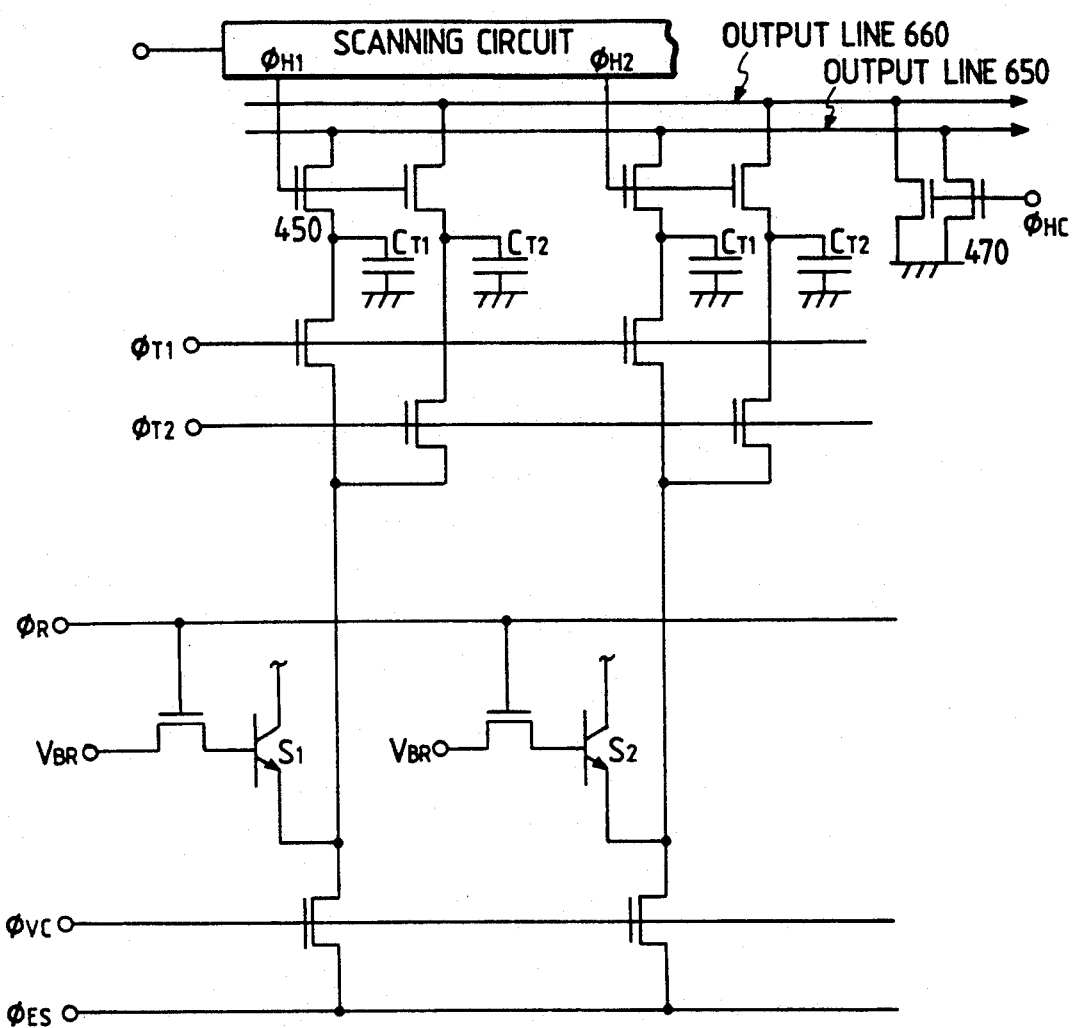
FIG. 26 is a circuit diagram showing the circuit structure of the 7th embodiment.

FIG. 26 is an equivalent circuit diagram of a photoelectric covnerting device with two pixels.

In general, such pixels are provided in a number of several hundred to several thousand in the ordinary line sensor. In the structure shown in FIG. 26, two capacitances $CT_1$, $CT_2$ are provided in the readout system. The capacitance $CT_1$ receives the signal S (photoelectrically converted signal S'+noise N) from the pixels (S1, S2, ..., Sn), while the capacitance $CT_2$ receives the noise N from said pixels. Said signal S and noise N are supplied, through a transistor 450 which is on-off controlled by driving pulses $\phi_{H1}, \phi_{H2}, \ldots, \phi_{Hn}$ from a scanning circuit, in succession to output lines 650, 660.

The signal S and noise N from said output lines are supplied to a differential amplifier (not shown in FIG. 26) for calculating the difference (S-N). In this manner the noise is eliminated from the signal, and there can be obtained the photoelectrically converted signal S' only.

The pulse applications to $\phi_{T1}$ and $\phi_{T2}$ for transferring the signal S to the capacitance $C_{T1}$ and the noise N to the capacitance $C_{T2}$ can be achieved in one of the following two timings, in consideration of the simplicity, and ease of driving.

In the first method, a pulse is supplied to $\phi_{T2}$ for transferring the noise N to the capacitance $C_{T2}$ immediately after the end of resetting at $t_1$, namely immediately after the start of charge accumulation, and a pulse is supplied to $\phi_{T1}$ for transferring the signal S to the capacitance $C_{T1}$ immediately before the end of charge accumulation at $t_2$. In this case the correction of the fixed pattern noises is conducted by the signals S, N in a same accumulating period, and other noises generated at the end of resetting can also be corrected.

In the second method, a pulse is supplied to $\phi_{T1}$ for transferring the signal S to the capacitance $C_{T1}$ immediately before the end of charge accumulation at $t_2$, then the resetting operation is executed, and a pulse is supplied to $\phi_{T2}$ for transferring the noise N to the capacitance $C_{T2}$ immediately after the start of a next accumulation at $t_1$. This method allows to prevent the deterioration of accuracy of noise correction, resulting from external noises, because the interval from the transfer of the signal S to the capacitance $C_{T1}$ to the calculation of difference can be made shorter than that in the above-mentioned first method.

In the following there wil be explained certain examples of the information processing apparatus employing the photoelectric converting devices of the foregoing embodiments.

On a ceramic substrate, there can be provided plural photoelectric converting devices in a linear or staggered array. Such array is arranged on a support member, together with a light source such as an LED and/or an optical system such as a short-focus imaging element array, to constitute an information processing unit, which is interchangeably mounted on a main body of the apparatus such as a facsimile apparatus. The image information read from an original image is recorded on a recording medium, by means of an ink jet recording head constituting recording means, whereby said image information is reproduced. Said recording head advantageously employs a structure for discharging liquid ink, utilizing thermal energy.

As explained in the foregoing, the present invention has been reached through analysis and elimination of the causes of the random noises, and provides a photoelectric converting device and an information processing apparatus, with an improved S/N ratio.

What is claimed is:

1. A photoelectric converting device provided with a control electrode area of a semiconductor of a first conductive type and at least two main electrode areas of a semiconductor of a second conductive type different from said first conductive type, and capable of accumulating photo-generated carriers in said control electrode area;

wherein said control electrode area become substantially depleted at the resetting operation.

2. A photoelectric converting device according to claim 1, wherein one of said main electrode areas is connected to an output circuit including a capacitative load, and further comprising switch means for switching one of said main electrode areas between a state electrically connected to a reference voltage source and a floating state.

3. A photoelectric converting device provided with a photoelectric converting cell including a control electrode area of a first conductive type capable of accumulating carriers generated by light energy, and first and second main electrode areas of a second conductive type different from said first conductive type, comprising:

resetting means for effecting a first resetting for maintaining said first main electrode area at a high impedance state thereby substantially depleting said control electrode area, and, after said first resetting, a second resetting for shifting said first main electrode area to a low impedance state.

4. A photoelectric converting device, comprising:

a first main electrode area including a first semiconductive area of a semiconductor of a first conductive type, and a second semiconductive area of a semiconductor of said first conductive type with a lower resistnace than in said first semiconductive area;

a control electrode area of a semiconductor of a second conductive type different from said first conductive type, positioned adjacent to said second semiconductive area; and a second main electrode area of a semiconductor of the first conductive type, positioned adjacent to said control electrode area;

wherein said control electrode area has an impurity concentration and a layer thickness enough for causing said control electrode area to be substantially depleted at the resetting operation.

5. A photoelectric converting device provided with a control electrode area of a semiconductor of a frist conductive type, and at least two main electrode areas of a semiconductor of a second conductive type different from said first conductive type, and capable of accumulating photo-generated carriers in said control electrode area, comprising:

a charge-coupled device for transferring the charge in said control electrode area for the setting operation.

6. An information processing apparatus comprising the photoelectric converting device according to claim 1, a light source, and an optical system arranged on a support member.

7. An information processing apparatus comprising:
image reading means including the photoelectric converting device according to claim 1, a light source and an optical system; and
recording means for recording the image information read by said image reading means.

8. An information processing apparatus comprising:
image reading means including the photoelectric converting device according to claim 1, a light source and an optical system; and
recording means for recording the image information read by said image reading means;
wherein said recording means is an ink jet recording head for discharging ink, utilizing thermal energy.

* * * * *

UNITED STATES PATENT AND TRADEMARK OFFICE
CERTIFICATE OF CORRECTION

PATENT NO. : 5,283,428
DATED : February 1, 1994
INVENTOR(S) : MASAKAZU MORISHITA ET AL.

It is certified that error appears in the above-identified patent and that said Letters Patent is hereby corrected as shown below:

COLUMN 2

Line 36, "area; a control" should read --area; ¶ a control--.

COLUMN 3

Line 66, "an" should read --a--.

COLUMN 4

Line 8, "are" should be deleted.

COLUMN 9

Line 42, "said" should read --Said--.

COLUMN 11

Line 28, "fomred" should read --formed--.

COLUMN 12

Line 43, "capacitative" should read --capacitive--.
Line 47, "capacitative" should read --capacitive--.
Line 66, "aboveexplained" should read --above-explained--.

UNITED STATES PATENT AND TRADEMARK OFFICE
CERTIFICATE OF CORRECTION

PATENT NO. : 5,283,428
DATED : February 1, 1994
INVENTOR(S) : MASAKAZU MORISHITA ET AL.

It is certified that error appears in the above-identified patent and that said Letters Patent is hereby corrected as shown below:

COLUMN 13

Line 4, "example" should read --example,--.
    Line 67, "capacitative" should read --capacitive--.

COLUMN 22

Line 30, "become" should read --becomes--.
    Line 58, "resistnace" should read --resistance--.

COLUMM 23

Line 5, "frist" should read --first--.

Signed and Sealed this

Twenty-third Day of August, 1994

Attest:

BRUCE LEHMAN

Attesting Officer      Commissioner of Patents and Trademarks